(12) United States Patent
Kao et al.

(10) Patent No.: US 12,198,984 B2
(45) Date of Patent: *Jan. 14, 2025

(54) SEMICONDUCTOR DEVICE INCLUDING GATE SPACER WITH TILTED PORTION AND METHOD OF MANUFACTURING THEREOF

(71) Applicant: Taiwan Semiconductor Manufacturing Company, Ltd., Hsinchu (TW)

(72) Inventors: Kuei-Yu Kao, Hsinchu (TW); Chao-Cheng Chen, Hsinchu (TW); Chih-Han Lin, Hsinchu (TW); Chen-Ping Chen, Toucheng Township (TW); Ming-Ching Chang, Hsinchu (TW); Shih-Yao Lin, New Taipei (TW); Chih-Chung Chiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/426,852

(22) Filed: Jan. 30, 2024

(65) Prior Publication Data
US 2024/0170336 A1 May 23, 2024

Related U.S. Application Data

(63) Continuation of application No. 17/460,213, filed on Aug. 28, 2021, now Pat. No. 11,908,746.

(51) Int. Cl.
*H01L 21/8234* (2006.01)
*H01L 29/06* (2006.01)
(Continued)

(52) U.S. Cl.
CPC ........... *H01L 21/823468* (2013.01); *H01L 21/823431* (2013.01); *H01L 29/0673* (2013.01);
(Continued)

(58) Field of Classification Search
CPC ..... H01L 21/823431; H01L 21/823468; H01L 21/823821; H01L 21/823864;
(Continued)

(56) References Cited

U.S. PATENT DOCUMENTS

2020/0395470 A1 12/2020 Kim et al.
2022/0165729 A1 5/2022 Shin et al.

OTHER PUBLICATIONS

Non-Final Office Action on U.S. Appl. No. 17/460,213 Dtd Jun. 22, 2023.

(Continued)

*Primary Examiner* — Cheung Lee
(74) *Attorney, Agent, or Firm* — FOLEY & LARDNER LLP

(57) ABSTRACT

A semiconductor device includes a plurality of semiconductor layers vertically separated from one another. The semiconductor device includes a gate structure that comprises a lower portion and an upper portion, wherein the lower portion wraps around each of the plurality of semiconductor layers. The semiconductor device includes a gate spacer that extends along a sidewall of the upper portion of the gate structure and has a bottom surface. A portion of the bottom surface of the gate spacer and a top surface of a topmost one of the plurality of semiconductor layers form an angle that is less than 90 degrees.

20 Claims, 22 Drawing Sheets

(51) Int. Cl.
   *H01L 29/423* (2006.01)
   *H01L 29/66* (2006.01)
   *H01L 29/786* (2006.01)

(52) U.S. Cl.
   CPC .. *H01L 29/42392* (2013.01); *H01L 29/66545* (2013.01); *H01L 29/6656* (2013.01); *H01L 29/66742* (2013.01); *H01L 29/78618* (2013.01)

(58) Field of Classification Search
   CPC .......... H01L 29/0673; H01L 29/42376; H01L 29/42392; H01L 29/66439; H01L 29/66545; H01L 29/6656; H01L 29/66742; H01L 29/66795; H01L 29/6681; H01L 29/775; H01L 29/78618; H01L 29/78696
   See application file for complete search history.

(56) References Cited

OTHER PUBLICATIONS

Notice of Allowance on U.S. Appl. No. 17/460,213 Dtd Oct. 20, 2023.

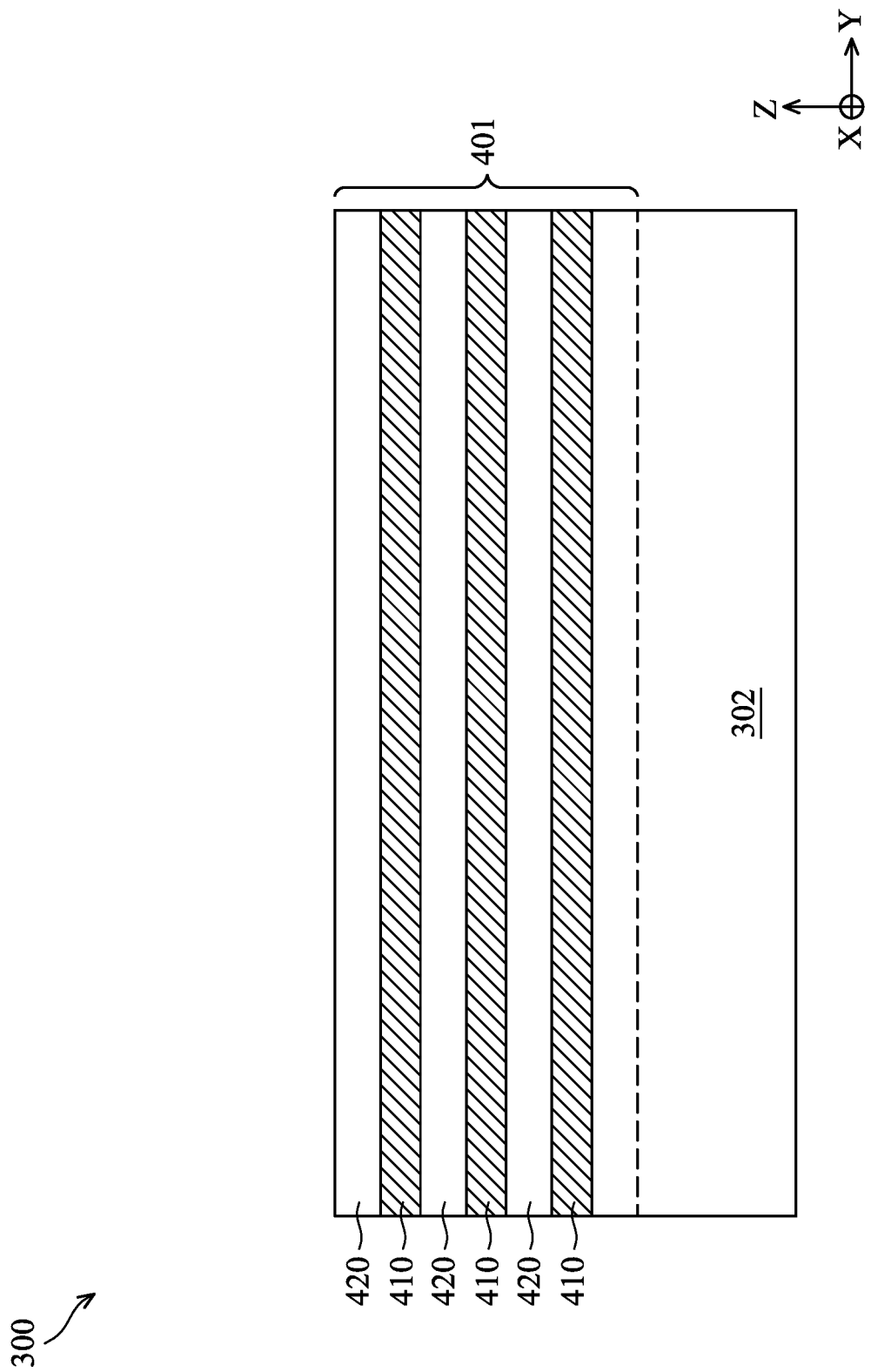

SEMICONDUCTOR DEVICE INCLUDING GATE SPACER WITH TILTED PORTION AND METHOD OF MANUFACTURING THEREOF

CROSS-REFERENCE TO RELATED APPLICATIONS

This application is a Continuation of U.S. patent application Ser. No. 17/460,213, filed Aug. 28, 2021. The entire disclosure of U.S. patent application Ser. No. 17/460,213 is incorporated herein by reference.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5, 6, 7A, 7B, 8, 9A, 9B, 10, 11, 12, 13, 14A, 14B, 15A, 15B, 16A, and 16B illustrate cross-sectional views of an example GAA FET device (or a portion of the example GAA FET device) during various fabrication stages, made by the method of FIG. 2, in accordance with some embodiments.

DETAILED DESCRIPTION

Figure 1:
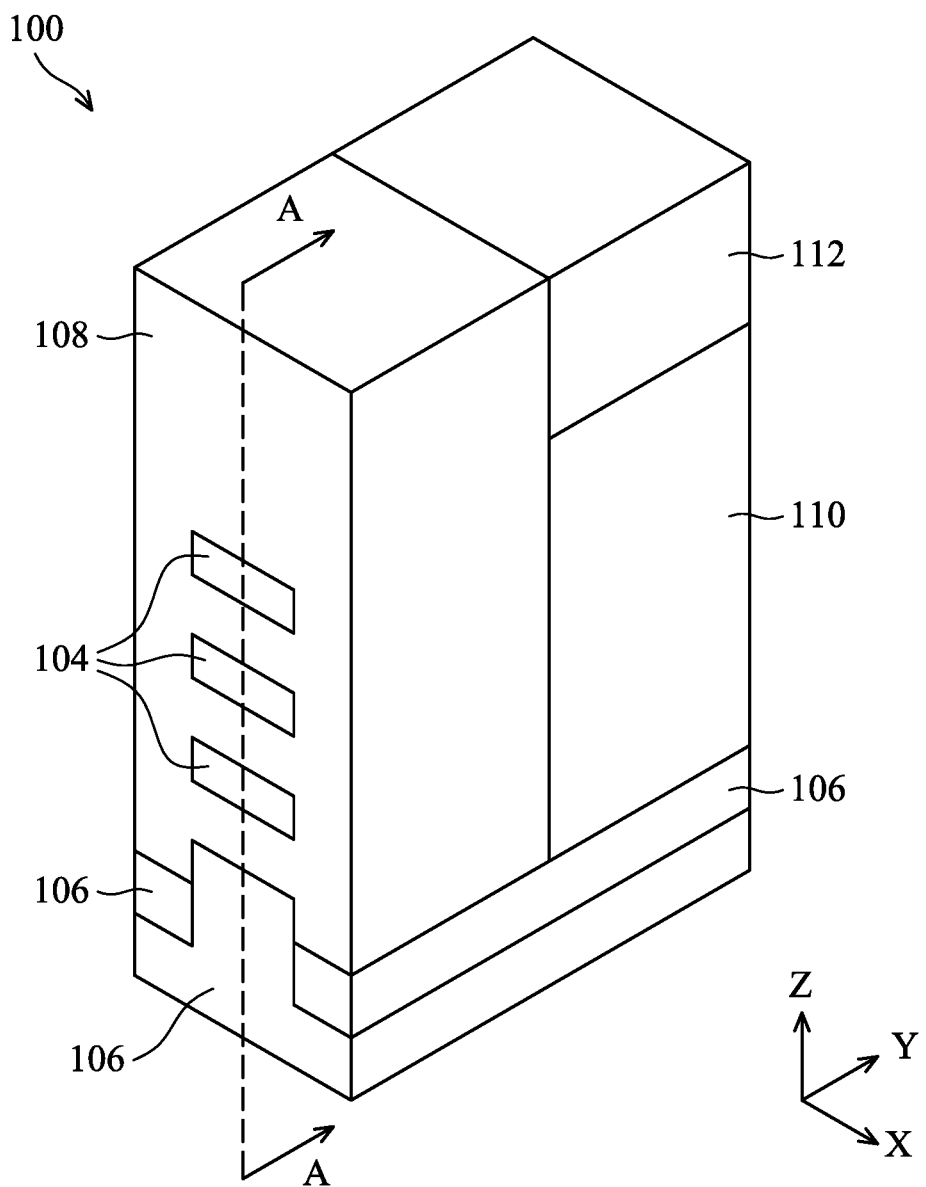
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a gate-all-around (GAA) field-effect-transistor (FET) device, and in particular, in the context of forming a replacement gate of a GAA FET device. In some embodiments, an etch stop layer is formed over a fin structure including a number of first semiconductor layers and a number of second semiconductor layers, which serve as sacrificial layers and channel layers, respectively. Next, a dummy gate structure is formed over the fin structure, with the etch stop layer disposed therebetween. The dummy gate structure may then be used as a mask to pattern the etch stop layer. Next, a gate spacer is formed to extend a sidewall collectively formed by the dummy gate structure and the patterned etch stop layer. Next, source/drain structures are formed on opposite sides of the dummy gate structure, with the gate spacer extending along sidewalls of an upper portion of the dummy gate structure. Upon forming an interlayer dielectric (ILD) over the source/drain structures, the dummy gate structure is removed to form a gate trench, followed by breaking through at least a majority portion of the patterned etch stop layer to expose the topmost first or second semiconductor layer. Next, the sacrificial layers are removed to extend the gate trench. An active gate structure is next formed in the gate trench to wrap around each of the channel layers.

Generally, the etch stop layer is formed to protect the channel layers (e.g., the topmost channel layer) when removing the dummy gate structure. In existing technologies, such an etch stop layer remains substantially intact until the dummy gate structure and the gate spacer are used as a mask to form the source/drain structures. Consequently, the gate spacer is essentially formed on top of the remaining etch stop layer, which may cause various issues when to form the active gate structure. For example, if the remaining etch stop layer is also removed during the removal of the dummy gate structure and/or the breakthrough of the etch stop layer, the later formed active gate structure and one or more of the source/drain structures may be electrically coupled to each other (e.g., forming a short circuit). A transistor, made by the existing technologies, may improperly function.

An active gate structure formed by the above described method can provide various advantages in advanced technology nodes. For example, the etch stop layer is patterned following the step of forming the dummy gate structure and prior to forming the gate spacer. In various embodiments, such an etch stop layer, patterned through the dummy gate structure, can present a mesa-like profile, with a relatively wider lower portion. This wider lower portion can cause the subsequently formed gate spacer to have a tilted portion that extends along a sidewall of the patterned etch stop layer. Accordingly, the patterned etch stop layer is essentially "isolated" by the gate spacer. In the following process stages, even though no etch stop layer remains, no short circuit can be formed between the active gate structure and the source/drain structure. Further, the wider lower portion of the dummy gate structure can advantageously increase a process window to form the active gate structure. As a result, a transistor, made by the currently disclosed methods, can significantly increase its overall performance, while avoiding having the previously identified short circuit issues.

FIG. 1 illustrates a perspective view of an example GAA FET device 100, in accordance with various embodiments. The GAA FET device 100 includes a substrate 102 and a number of nanostructures (e.g., nanosheets, nanowires, etc.) 104 above the substrate 102. The semiconductor layers 104 are vertically separated from one another. Isolation structures 106 are formed on opposing sides of a protruded portion of the substrate 102, with the nanostructures 104 disposed above the protruded portion. A gate structure 108 wraps around each of the nanostructures 104 (e.g., a full perimeter of each of the nanostructures 104). Source/drain structures are disposed on opposing sides of the gate structure 108, e.g., source/drain structure 110 shown in FIG. 1. An interlayer dielectric (ILD) 112 is disposed over the source/drain structure 110.

FIG. 1 depicts a simplified GAA FET device, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A extends along a longitudinal axis of the semiconductor layers 104 and in a direction of a current flow between the source/drain structures (e.g., in the Y direction). Subsequent figures refer to this reference cross-section for clarity.

Figure 2:
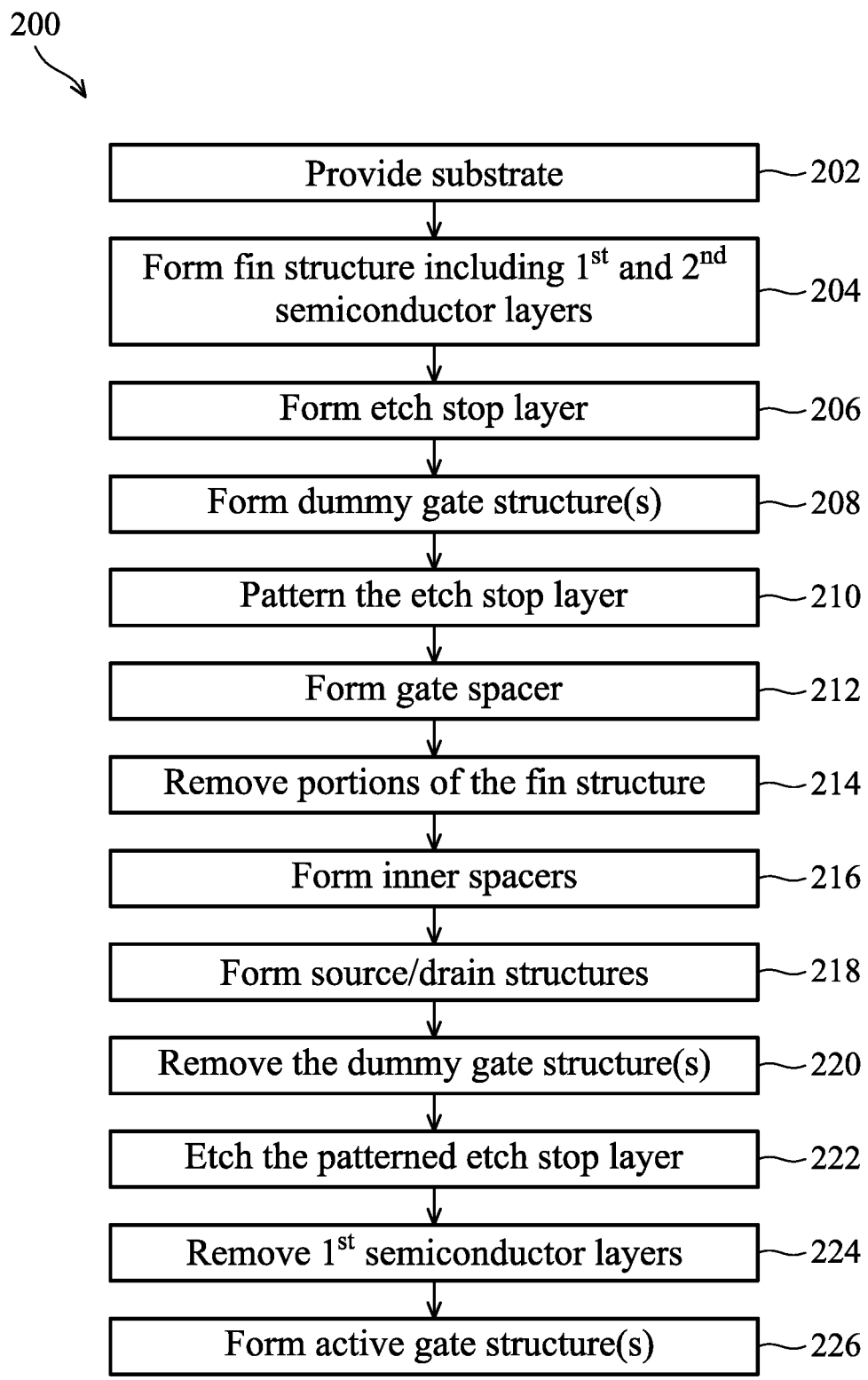
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4A, 4B, 5, 6, 7A, 7B, 8, 9A, 9B, 10, 11, 12, 13, 14A, 14B, 15A, 15B, 16A, and 16B, respectively, which will be discussed in further detail below.

In brief overview, the method 200 starts with operation 202 of providing a substrate. The method 200 continues to operation 204 of forming a fin structure including a number of first semiconductor layers and a number of second semiconductor layers. The method 200 continues to operation 206 of forming an etch stop layer. The method 200 continues to operation 208 of forming one or more dummy gate structures. The method 200 continues to operation 210 of patterning the etch stop layer. The method 200 continues to operation 212 of forming a gate spacer. The method 200 continues to operation 214 of removing portions of the fin structure. The method 200 continues to operation 216 of forming inner spacers. The method 200 continues to operation 218 of forming source/drain structures. The method 200 continues to operation 220 of removing the one or more dummy gate structures. The method 200 continues to operation 222 of etching the patterned etch stop layer. The method 200 continues to operation 224 of removing the first semiconductor layers. The method 200 continues to operation 226 of forming one or more active gate structures.

As mentioned above, FIGS. 3-16B each illustrate, in a cross-sectional view, a portion of a GAA FET device 300 at various fabrication stages of the method 200 of FIG. 2. The GAA FET device 300 is similar to the GAA FET device 100 shown in FIG. 1, but with multiple gate structures. Although FIGS. 3-16B illustrate the GAA FET device 300, it is understood the GAA FET device 300 may include a number of other devices such as inductors, fuses, capacitors, coils, etc., which are not shown in FIGS. 3-16B, for purposes of clarity of illustration.

Figure 3:
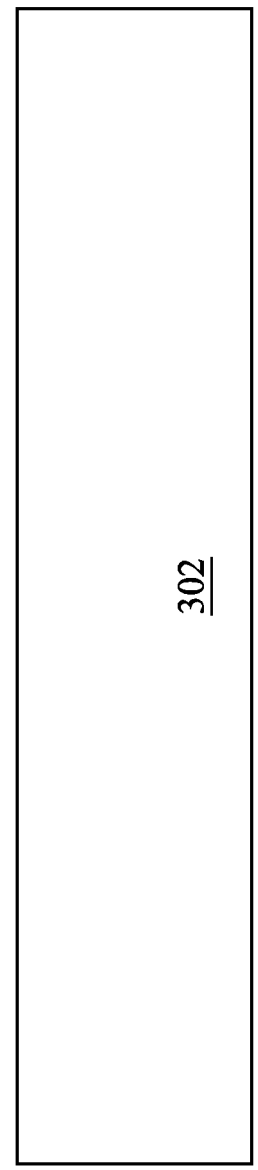

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction perpendicular to the lengthwise direction of an active/dummy gate structure of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4B:
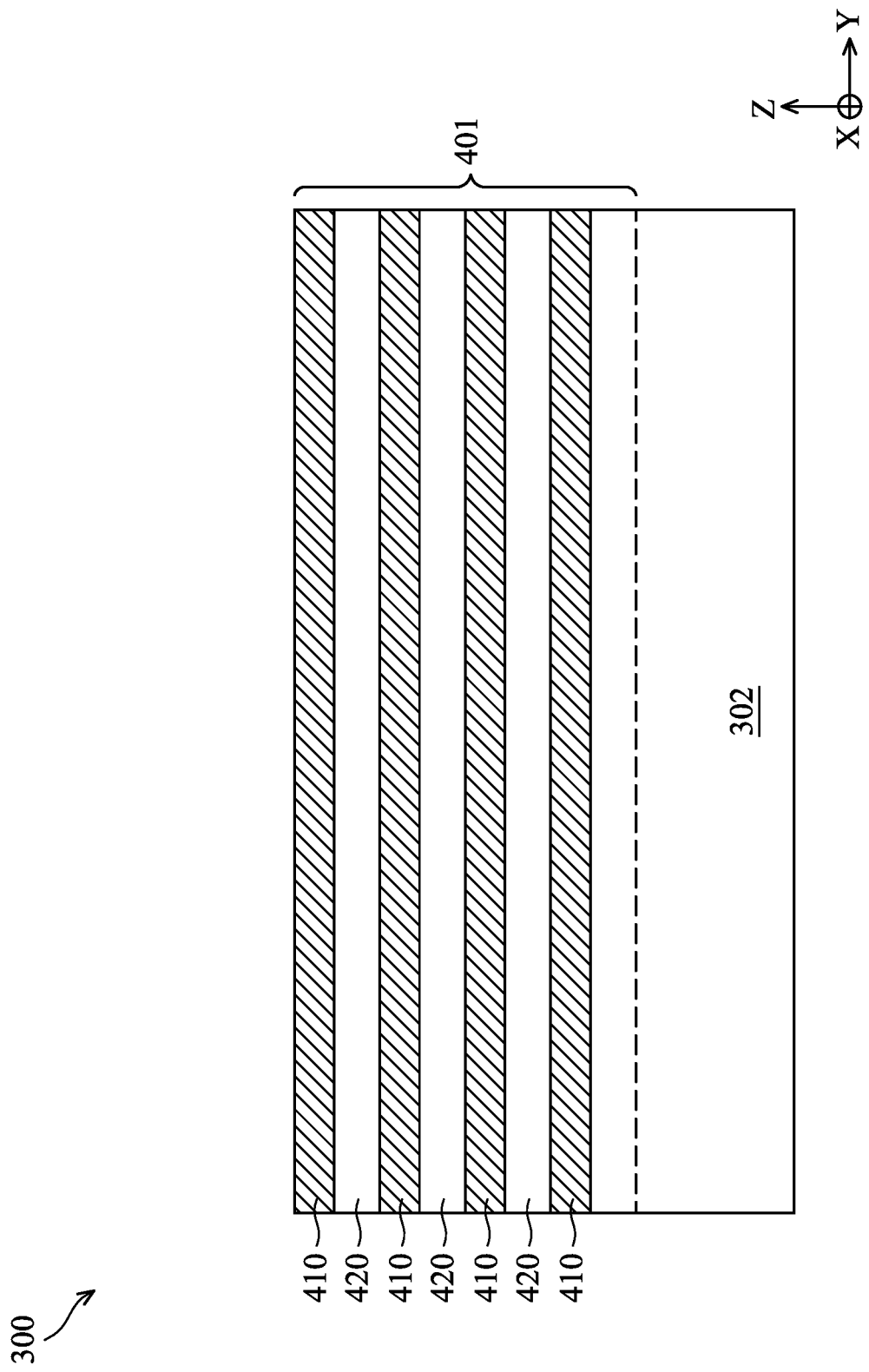

Corresponding to operation 204 of FIG. 2, FIG. 4A is a cross-sectional view of the GAA FET device 300 including a number of first semiconductor layers 410 and a number of second semiconductor layers 420 formed on the substrate 302 at one of the various stages of fabrication. Still corresponding to operation 204 of FIG. 2, FIG. 4B is a cross-sectional view of the GAA FET device 300 including a different number of the first semiconductor layers 410 and the same number of second semiconductor layers 420 formed on the substrate 302 at one of the various stages of fabrication. The cross-sectional views of FIGS. 4A-B are each cut in a direction perpendicular to the lengthwise direction of an active/dummy gate structure of the GAA FET device 300 (e.g., cross-section A-A indicated in FIG. 1).

Referring first to FIG. 4A, the first semiconductor layers 410 and the second semiconductor layers 420 are alternatingly disposed on top of one another (e.g., along the Z direction) to form a first stack. For example, one of the second semiconductor layers 420 is disposed over one of the first semiconductor layers 410 then another one of the first semiconductor layers 420 is disposed over the second semiconductor layer 410, so on and so forth. Similar in FIG. 4B, the first semiconductor layers 410 and the second semiconductor layers 420 are alternatingly disposed on top of one another (e.g., along a vertical direction) to form a second stack.

The first and second stacks may include any number of alternately disposed first and second semiconductor layers 410 and 420, respectively. For example in FIG. 4A, the first stack includes 3 first semiconductor layers 410, with 2 second semiconductor layers 420 alternatingly disposed therebetween and with one of the second semiconductor layer 420 being the topmost semiconductor layer; and for example in FIG. 4B, the second stack includes 4 first semiconductor layers 410, with 3 second semiconductor layers 420 alternatingly disposed therebetween and with one of the first semiconductor layers 410 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure. In most of the following discussion, the stack shown in FIG. 4A will be used as a representative example.

The semiconductor layers 410 and 420 may have respective different thicknesses. Further, the first semiconductor layers 410 may have different thicknesses from one layer to another layer. The second semiconductor layers 420 may have different thicknesses from one layer to another layer. The thickness of each of the semiconductor layers 410 and 420 may range from few nanometers to few tens of nanometers. The first layer of the stack may be thicker than other semiconductor layers 410 and 420. In an embodiment, each of the first semiconductor layers 410 has a thickness ranging from about 5 nanometers (nm) to about 20 nm, and each of the second semiconductor layers 420 has a thickness ranging from about 5 nm to about 20 nm.

The two semiconductor layers 410 and 420 have different compositions. In various embodiments, the two semiconductor layers 410 and 420 have compositions that provide for different oxidation rates and/or different etch selectivity between the layers. In an embodiment, the first semiconductor layers 410 include silicon germanium ($Si_{1-x}Ge_x$), and the second semiconductor layers include silicon (Si). In an embodiment, each of the semiconductor layers 420 is silicon that may be undoped or substantially dopant-free (i.e., having an extrinsic dopant concentration from about 0 $cm^3$ to about $1 \times 10^{17}$ $cm^3$), where for example, no intentional doping is performed when forming the layers 420 (e.g., of silicon).

In various embodiments, the semiconductor layers 420 may be intentionally doped. For example, when the GAA FET device 300 is configured in n-type (and operates in an enhancement mode), each of the semiconductor layers 420 may be silicon that is doped with a p-type dopant such as boron (B), aluminum (Al), indium (In), and gallium (Ga); and when the GAA FET device 300 is configured in p-type (and operates in an enhancement mode), each of the semiconductor layers 420 may be silicon that is doped with an n-type dopant such as phosphorus (P), arsenic (As), antimony (Sb). In another example, when the GAA FET device 300 is configured in n-type (and operates in a depletion mode), each of the semiconductor layers 420 may be silicon that is doped with an n-type dopant instead; and when the GAA FET device 300 is configured in p-type (and operates in a depletion mode), each of the semiconductor layers 420 may be silicon that is doped with a p-type dopant instead. In some embodiments, each of the semiconductor layers 410 is $Si_{1-x}Ge_x$ that includes less than 50% (x<0.5) Ge in molar ratio. For example, Ge may comprise about 15% to 35% of the semiconductor layers 328 of $Si_{1-x}Ge_x$ in molar ratio. Furthermore, the first semiconductor layers 410 may include different compositions among them, and the second semiconductor layers 420 may include different compositions among them.

Either of the semiconductor layers 410 and 420 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 410 and 420 may be chosen based on providing differing oxidation rates and/or etch selectivity.

The semiconductor layers 410 and 420 can be epitaxially grown from the semiconductor substrate 302. For example, each of the semiconductor layers 410 and 420 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 410 and 420 having the same crystal orientation with the semiconductor substrate 302.

Upon growing the semiconductor layers 410 and 420 on the semiconductor substrate 302 (as a stack), the stack may be patterned to form one or more fin structures (e.g., 401). Each of the fin structures is elongated along a lateral direction (e.g., the Y direction), and includes a stack of patterned semiconductor layers 410-420 interleaved with each other. The fin structure 401 is formed by patterning the semiconductor layers 410-420 and the semiconductor substrate 302 using, for example, photolithography and etching techniques. For example, a mask layer (which can include multiple layers such as, for example, a pad oxide layer and an overlying pad nitride layer) is formed over the topmost semiconductor layer (e.g., 410 in FIG. 4A, or 420 in FIG. 4B). The pad oxide layer may be a thin film comprising silicon oxide formed, for example, using a thermal oxidation process. The pad oxide layer may act as an adhesion layer between the topmost semiconductor layer 410 (or the semiconductor layer 420 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 410-420 and the substrate 302 to form trenches (or openings), thereby defining the fin structures 401 between adjacent trenches. When multiple fin structures are formed, such a trench may be disposed between any adjacent ones of the fin structures. In some embodiments, the fin structure 401 is formed by etching trenches in the semiconductor layers 410-420 and substrate 302 using, for example, reactive ion etch (RIE), neutral beam etch (NBE), the like, or combinations thereof.

The etch may be anisotropic. In some embodiments, the trenches may be strips (when viewed from the top) parallel to each other, and closely spaced with respect to each other. In some embodiments, the trenches may be continuous and surround the fin structure 401.

Figure 5:
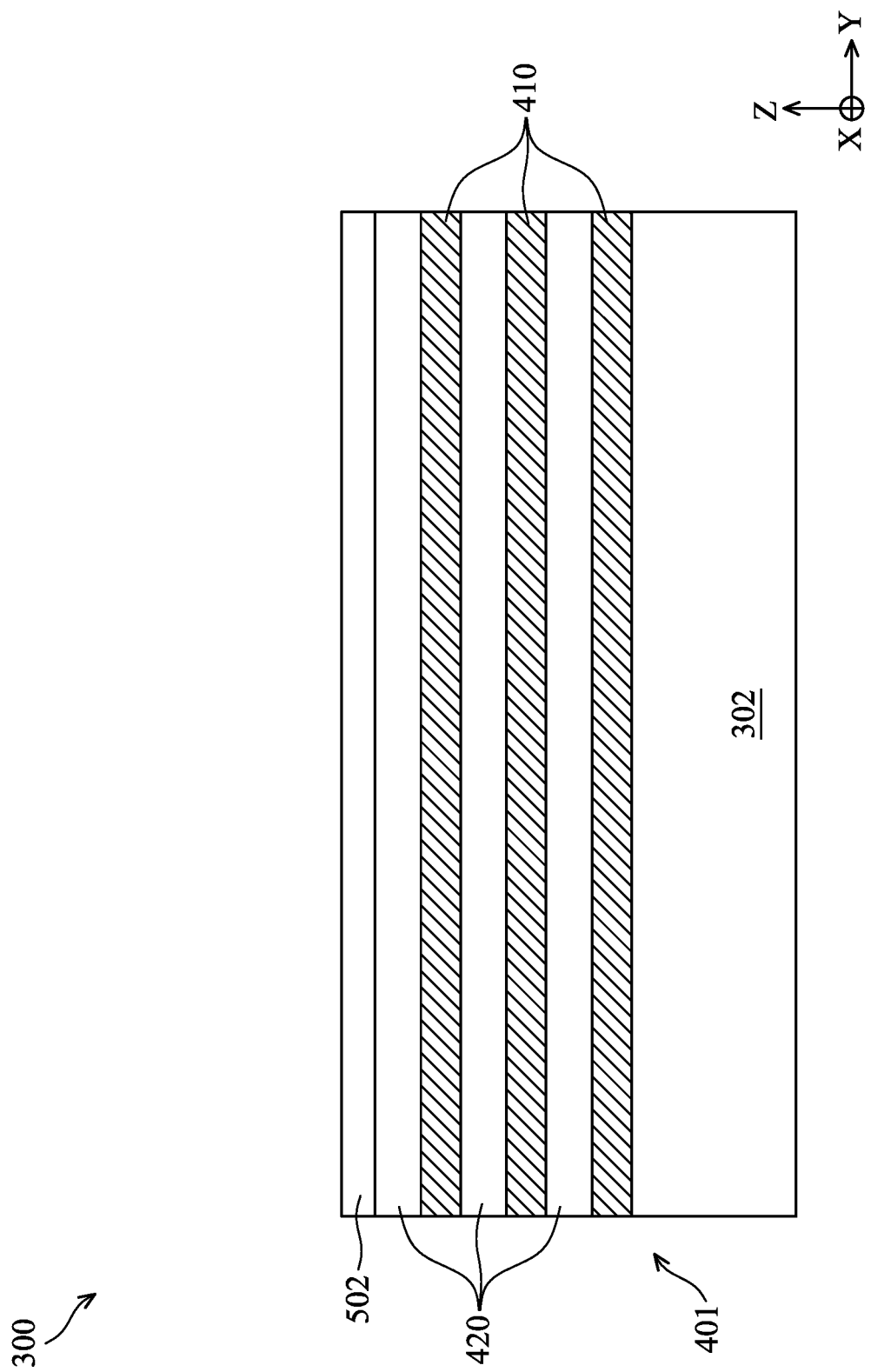

Corresponding to operation 206 of FIG. 2, FIG. 5 is a cross-sectional view of the GAA FET device 300 including an etch stop layer 502, at one of the various stages of fabrication. The cross-sectional view of FIG. 6 is cut in a direction perpendicular to the lengthwise direction of an active/dummy gate structure of the GAA FET device 300 (e.g., cross-section A-A indicated in FIG. 1).

The etch stop layer (ESL) 502 can be formed over the fin structure 401. Although not shown, on each of the sides of the fin structure 401 (facing the X direction), a cladding layer (similar as the first semiconductor layer) and a dummy fin structure (overlaid or protected by a high-k dielectric layer) can be formed to produce a substantially planar top surface shared by the fin structure 401, the cladding layer, and the dummy fin structure. As used herein, the term "substantially planar" refers to a structure when the deviation of the structure from a plane is within the statistical atomic level variations inherent within semiconductor processing methods known in the art. In some embodiments, the ESL 502 may be formed over such a substantially planar top surface. In some other embodiments, the ESL 502 may be formed over only a top surface of the fin structure 401. The ESL 502 may include silicon oxide. The ESL 502 may be formed by a deposition process, such as chemical vapor deposition (CVD) (e.g., plasma enhanced chemical vapor deposition (PECVD), high aspect ratio process (HARP), or combinations thereof) process, atomic layer deposition (ALD) process, another applicable process, or combinations thereof.

Figure 6:
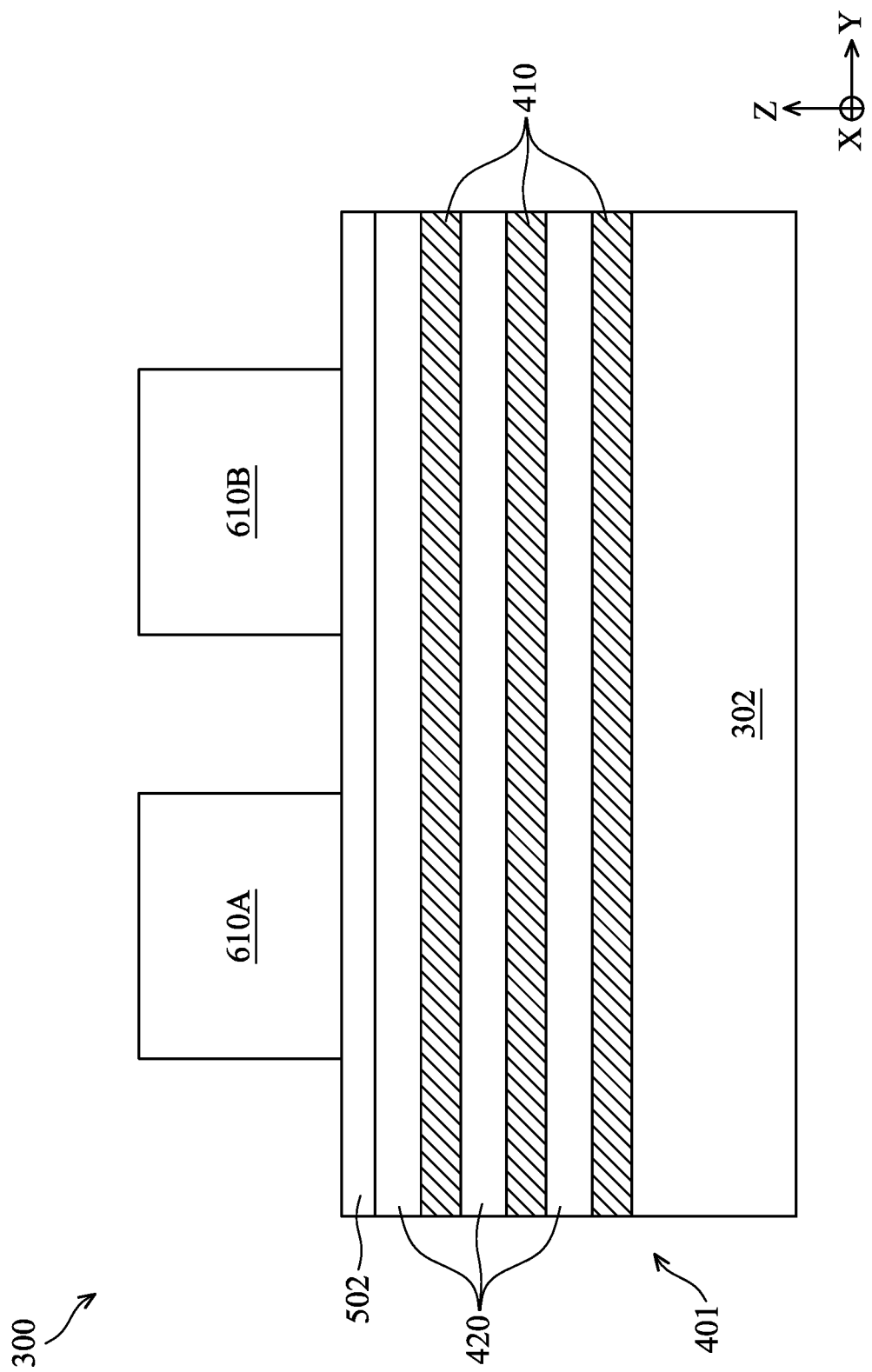

Corresponding to operation 208 of FIG. 2, FIG. 6 is a cross-sectional view of the GAA FET device 300 including one or more dummy gate structures 610A and 610B, at one of the various stages of fabrication. The cross-sectional view of FIG. 6 is cut in a direction perpendicular to the lengthwise direction of an active/dummy gate structure of the GAA FET device 300 (e.g., cross-section A-A indicated in FIG. 1).

The dummy gate structures 610A-B are formed over the ESL 502. The dummy gate structures 610A-B can each extend along a lateral direction (e.g., the X direction) perpendicular to the lateral direction along which the fin structure 401 extends. The dummy gate structures 610A-B may be placed where respective active (e.g., metal) gate structures are later formed, in various embodiments. For example in FIG. 6, each of the dummy gate structures 610A-B is placed over a respective portion of fin structure 401, with the ESL 502 sandwiched therebetween. Such an overlaid portion of the fin structure 401 can be later formed as a conduction channel, which includes portions of the second semiconductor layers 420. Further, the dummy gate structures 610A-B can each be replaced with an active gate structure to warp around each of the portions of the second semiconductor layers 420.

The dummy gate structures 610A-B can each include one or more silicon-based dielectric materials such as, for example, silicon oxide, silicon nitride, silicon oxynitride, silicon carbide, silicon carbonitride, silicon oxycarbonitride, silicon oxycarbide, multilayers thereof, or combinations thereof, and may be deposited. In some embodiments, the dummy gate structures 610A-B can each include one or more metal-based materials such as, for example, cobalt, tungsten, hafnium oxide, aluminum oxide, or combinations thereof, and may be deposited.

Figure 7A:
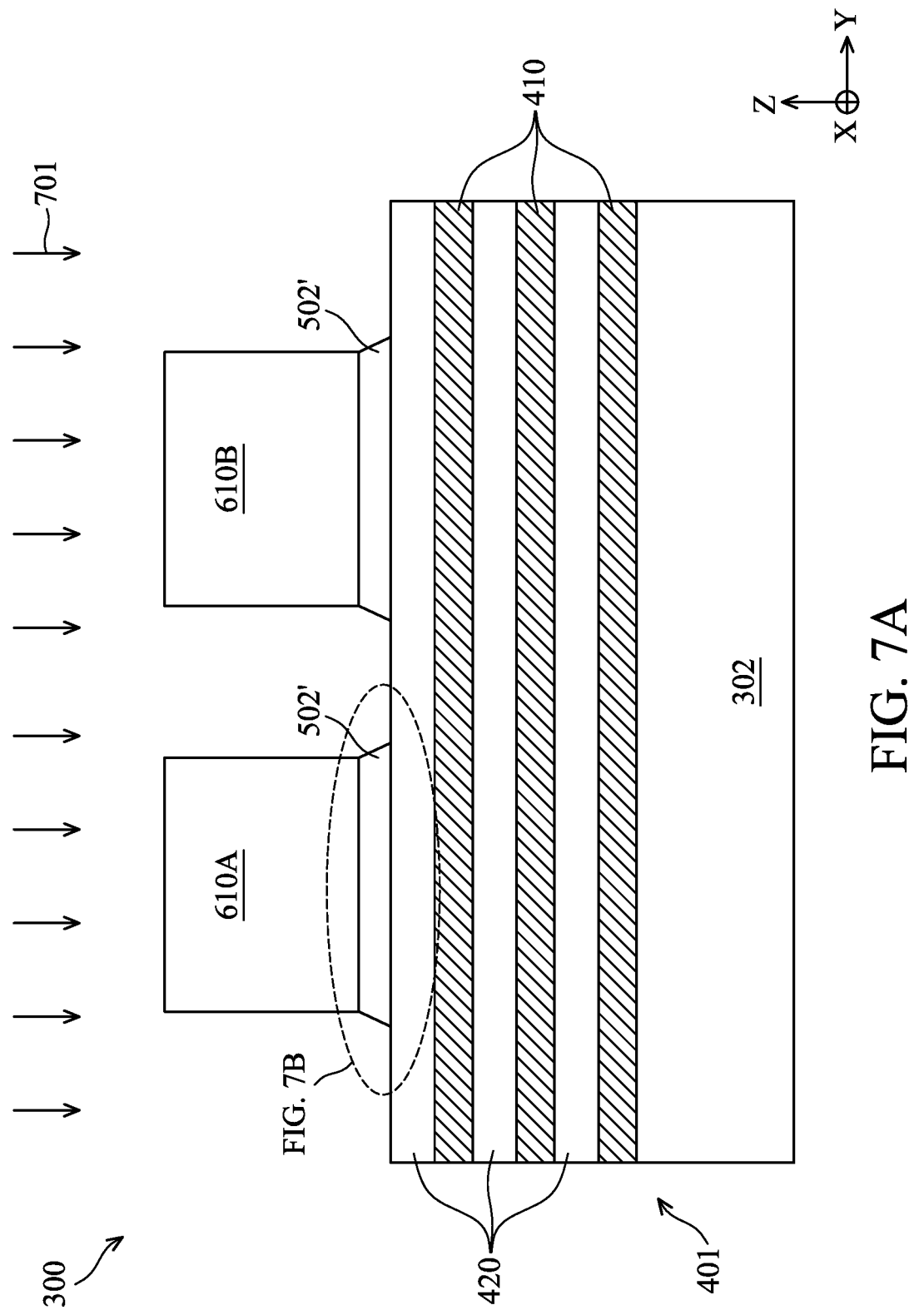
Figure 7B:
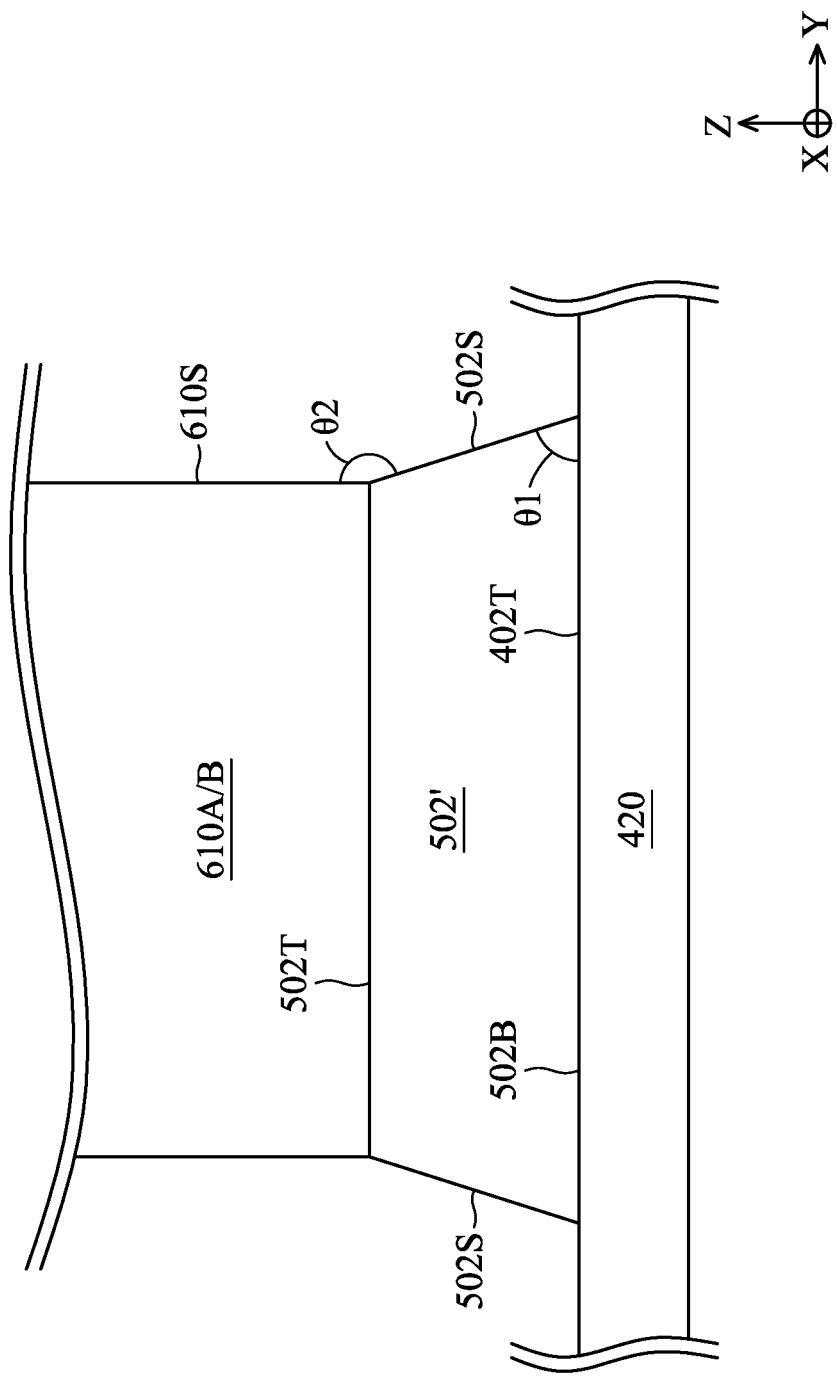

Corresponding to operation 210 of FIG. 2, FIG. 7A is a cross-sectional view of the GAA FET device 300 in which the ESL 502 is patterned (thereby forming a patterned ESL, 502'), at one of the various stages of fabrication. Further, FIG. 7B illustrates an enlarged, cross-sectional view of the GAA FET device 300 where the patterned ESL 502' is formed. The cross-sectional views of FIGS. 7A-B are each cut in a direction perpendicular to the lengthwise direction of an active/dummy gate structure of the GAA FET device 300 (e.g., cross-section A-A indicated in FIG. 1).

To pattern the ESL 502, portions of the ESL 502 that are not overlaid by the dummy gate structures 610A-B may be removed by an etching process 701, which can include one or more steps. By removing such portions of the ESL 502, the patterned ESL 502' is formed and the top surface of the topmost semiconductor layer 420 is exposed. In various embodiments of the present disclosure, the patterned ESL 502' may have a mesa-like profile, which can be better illustrated in the enlarged view of FIG. 7B. As shown, such a mesa-like profile of the patterned ESL 502' has a top surface 502T, a bottom surface 502B, and sidewalls 502S connecting the top and bottom surfaces. The top surface 502T may share the same width (extending along the Y direction) as the dummy gate structure 610A/B, and the bottom surface 502B is wider than the top surface 502T. Thus, the patterned ESL 502' can have the sidewalls 502S each tilted with respect to the top surface 420T of the topmost semiconductor layer 420. Further, the opposite sidewalls 502S may be tilted toward each other. In some embodiments, an angle, $\theta_1$, formed between the sidewall 502S and the top surface 420T is less than 90 degrees. For example, the angle $\theta_1$ may be between about 15 degrees and about 75 degrees. Another angle, $\theta_2$, formed between a sidewall 610S of the dummy gate structure 610A/B and the sidewall 502S is greater than 90 degrees. For example, the angle 82 may be between about 115 degrees and about 165 degrees.

The etching process 701 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to form the mesa-like patterned ESL 502'. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process 701. However, it is noted that source powers, bias powers, pressures, and flow rates outside of these ranges are also contemplated.

In another example, the etching process 701 can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to form the mesa-like patterned ESL 502'.

Figure 8:
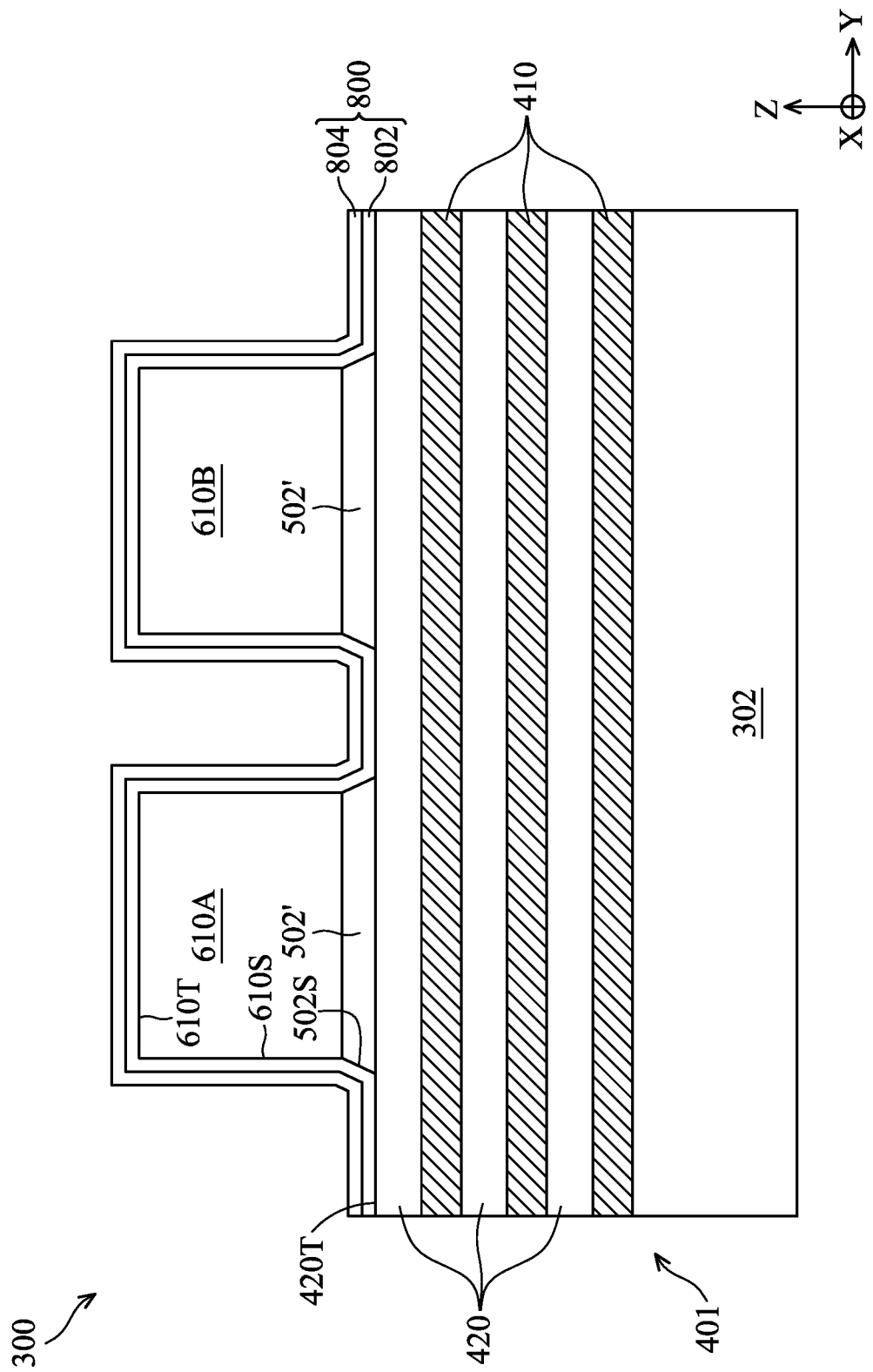

Corresponding to operation 212 of FIG. 2, FIG. 8 is a cross-sectional view of the GAA FET device 300 including a blanket gate spacer 800, at one of the various stages of fabrication. The cross-sectional views of FIG. 8 is cut in a direction perpendicular to the lengthwise direction of an active/dummy gate structure of the GAA FET device 300 (e.g., cross-section A-A indicated in FIG. 1).

The blanket gate spacer 800 is formed over the dummy gate structures 610A-B and the topmost semiconductor layer 420. As such, the blanket gate spacer 800 can overlay a top surface 610T of the dummy gate structures 610A-B, extend along the sidewall (of the dummy gate structure 610A/B) 610S and the sidewall (of the patterned ESL' 502') 502S, and overlay the exposed top surface 420T of the topmost semiconductor layer 420. The blanket gate spacer 800 may be (e.g., conformally) formed as a relatively thin layer, with a thickness ranging from about 2 angstroms (Å) to about 500 Å. Thus, at least a portion (e.g., a lower side portion) of the blanket gate spacer 800 can follow the tilted sidewall 502S.

The blanket gate spacer 800 can be formed as a combination of two conformal layers (e.g., 802 and 804). Each of the conformal layers 802 and 804 can line the top surface 420T, sidewall 502S, sidewall 610S, and the top surface 610T. Thus, at least one of the conformal layers can follow the tilted sidewall 502S. It should be understood that the gate spacer 802 can be formed as a combination of any number of conformal layers, while remaining within the scope of the present disclosure. For example, the gate spacer 802 may be formed as a single conformal layer. In the following discussions, the blanket gate spacer 800 that includes two layers shown in FIG. 8 will be used as a representative example.

In some embodiments, each of the conformal layers (e.g., 802, 804) includes a dielectric material selected from the group consisting of: silicon nitride, silicon oxynitride, silicon carbonitride, silicon carbide, silicon oxycarbide, the like, or combinations thereof. The conformal layer may be formed using atomic layer deposition (ALD), low-pressure chemical vapor deposition (LPCVD) or plasma enhanced chemical vapor deposition (PECVD), for example. Each of the conformal layers may have a thickness ranging from about 1 angstroms (Å) to about 250 Å.

Figure 9A:
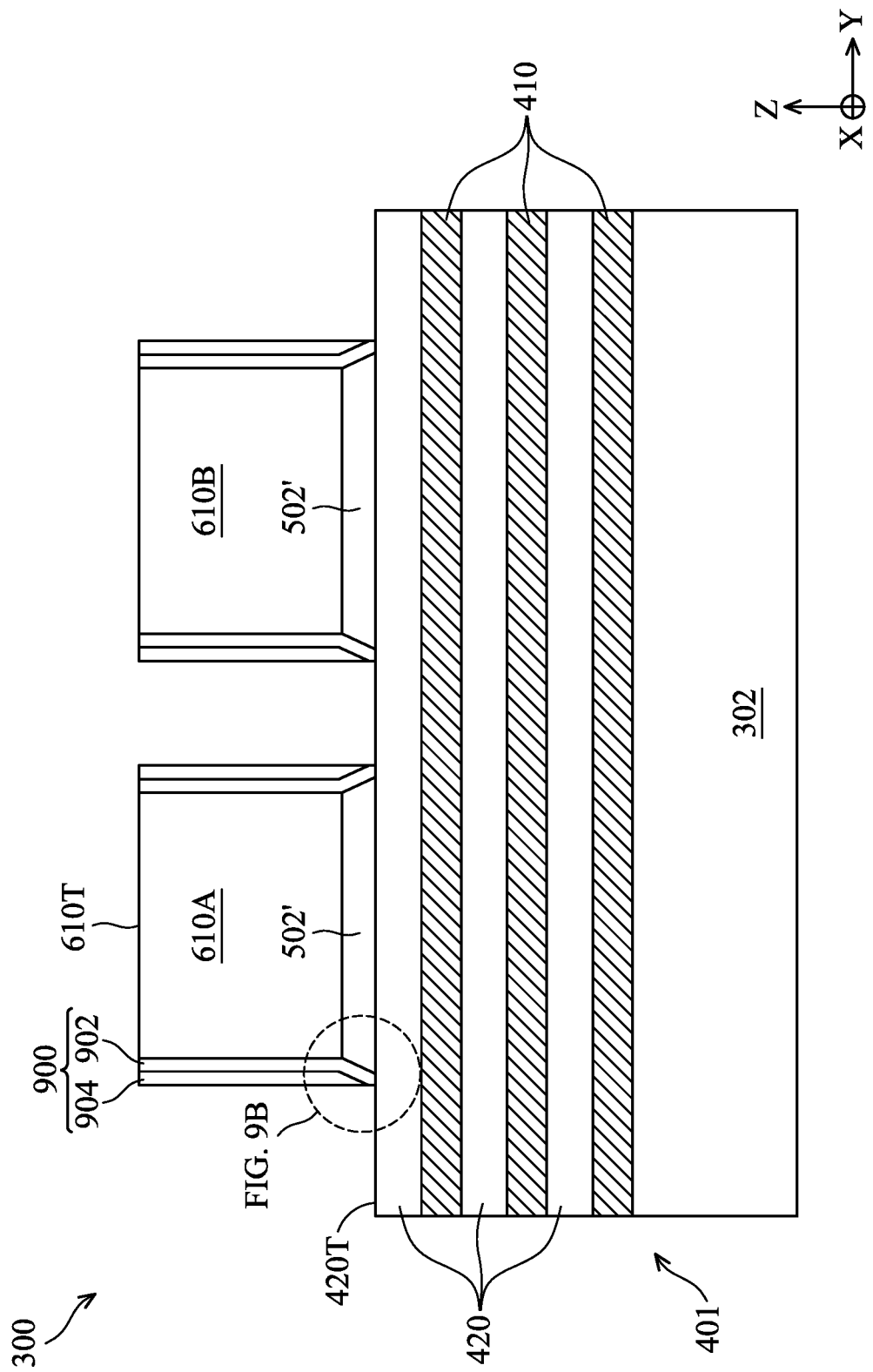
Figure 9B:
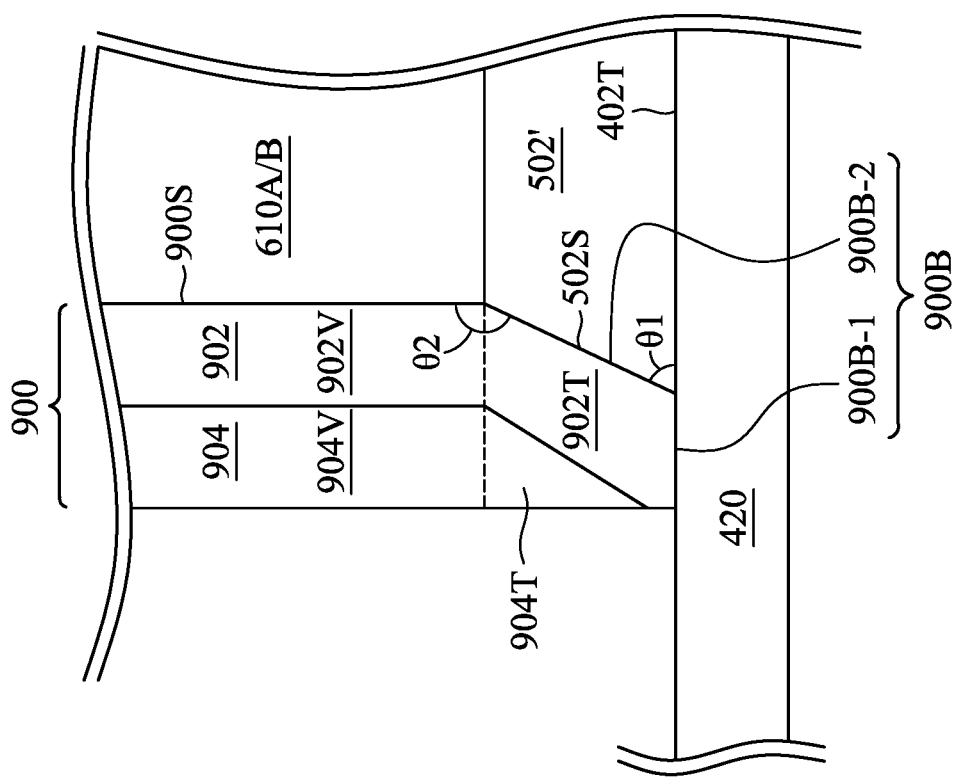

Referring next to FIG. 9A, illustrated is a cross-sectional view of the GAA FET device 300 in which the blanket gate spacer 800 is patterned to form a gate spacer 900, at one of the various stages of fabrication. Further, FIG. 9B illustrates an enlarged, cross-sectional view of the GAA FET device 300 around a lower portion of the gate spacer 900.

The gate spacer 900 is formed by removing (e.g., through anisotropic etching) portions of the blanket spacer 800 overlaying the top surface 610T of the dummy gate structures 610A-B and a portion of the top surface 420T of the topmost semiconductor layer 420. As such, each of the conformal layers 902 and 904 can have a vertical portion and a tilted portion. For example in FIG. 9B, the conformal layer 902 has a vertical portion 902V and a tilted portion 902T; and the conformal layer 904 has a vertical portion 904V and a tilted portion 904T. The vertical portion 902V can this form a sidewall, 900S, of the gate spacer 900. Specifically, the sidewall 900S may be substantially vertical with respect to the top surface 420T. The tilted portion 902T can thus form a bottom surface, 900B, of the gate spacer 900. Specifically, the bottom surface 900B can have a number of portions, at least a first one of which (e.g., 900B-2) is in contact with the sidewall 502S of the patterned ESL 502' and at least a second one of which (e.g., 900B-1) is in contact with a portion of the top surface 420T of the topmost semiconductor layer 420. Following the mesa-like profile of the patterned ESL 502', the conformal layer 902 can inherit the angles, $\theta_1$ and $\theta_2$. For example, the portion 900B-2 and the top surface 420T can form an angle that inherits $\theta_1$; and the portion 900B-2 of the bottom surface 900B and the sidewall 900S can form an angle that inherits $\theta_2$. The angle $\theta_1$ is less than 90 degrees, and the angle $\theta_2$ is greater than 90 degrees, in some embodiments. By forming the gate spacer 900 having such a tilted portion, the patterned ESL 502', which may be fully or partially replaced by an active gate structure, can be isolated or otherwise confined by the gate spacer 900.

Figure 10:
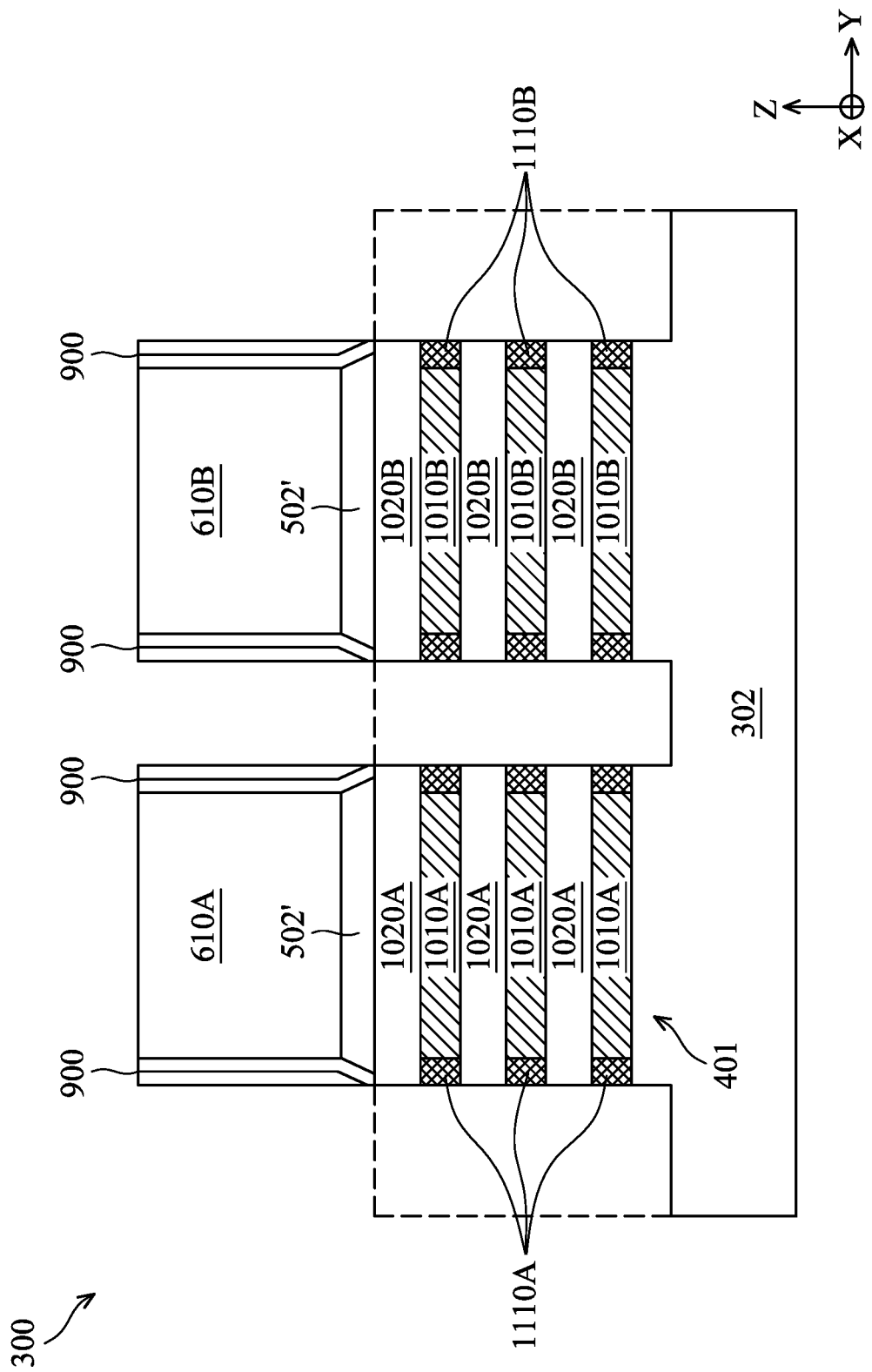

Corresponding to operation 214 of FIG. 2, FIG. 10 is a cross-sectional view of the GAA FET device 300 in which portions of the fin structure 401 (shown in dotted lines) that are not overlaid by the dummy gate structures 610A-B and the corresponding gate spacer 900 are removed, at one of the various stages of fabrication. The cross-sectional views of FIG. 10 is cut in a direction perpendicular to the lengthwise direction of an active/dummy gate structure of the GAA FET device 300 (e.g., cross-section A-A indicated in FIG. 1).

The dummy gate structures 610A-B and the gate spacer 900 can collectively serve as a mask to etch the non-overlaid portions of the fin structure 401, which results in the fin structure 401 having one or more alternatingly stacks including remaining portions of the semiconductor layers 410 and 420. As a result, along the Z direction, newly formed sidewalls of each of the fin structures 401 are aligned with sidewalls of the dummy gate structure 610A or 610B. For example in FIG. 10, semiconductor layers 101A and 1020A are the remaining portions of the semiconductor layers 410 and 420 overlaid by the dummy gate structure 610A, respectively; and semiconductor layers 1010B and 1020B are the remaining portions of the semiconductor layers 410 and 420 overlaid by the dummy gate structure 610B, respectively. In some embodiments, the semiconductor layers 101A, 1020A, 1010B, and 1020B may sometimes be referred to as nanostructures 101A, 1020A, 1010B, and 1020B, respectively.

Figure 11:
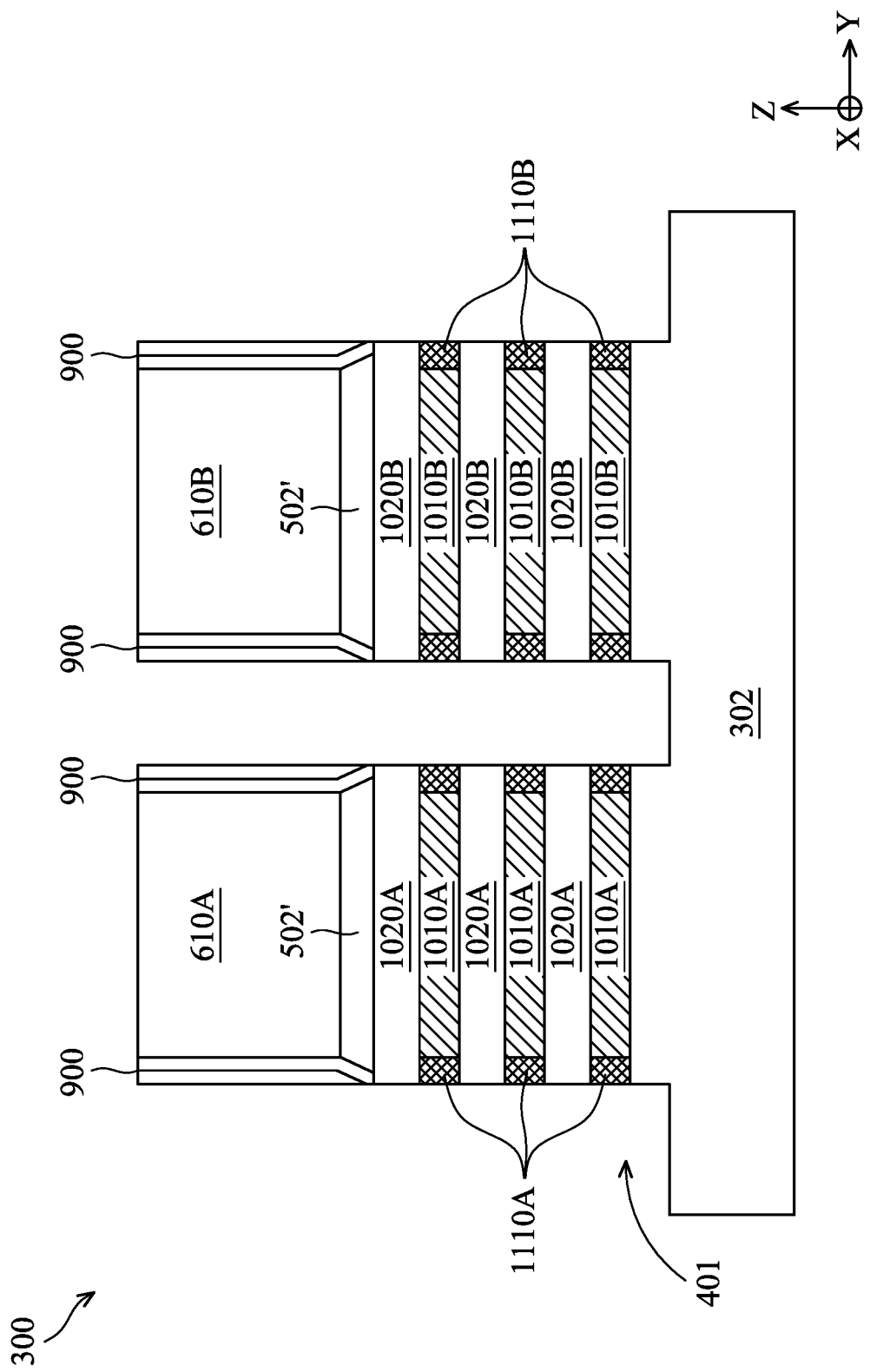

Corresponding to operation 216 of FIG. 2, FIG. 11 is a cross-sectional view of the GAA FET device 300 including inner spacers 1110A and 1110B, at one of the various stages of fabrication. The cross-sectional view of FIG. 11 is cut in a direction perpendicular to the lengthwise direction of an active/dummy gate structure of the GAA FET device 300 (e.g., cross-section A-A indicated in FIG. 1).

The inner spacers 1110A are formed along respective etched ends of the semiconductor layers 1010A; and the inner spacers 1110B are formed along respective etched ends of the semiconductor layers 1010B. To form the inner spacers 1110A-B, respective end portions of each of the semiconductor layers 1010A-B may first be removed. The end portions of the semiconductor layers 1010A-B can be removed (e.g., etched) using a "pull-back" process to pull the semiconductor layers 1010A-B back by an initial pull-back distance. Although in the illustrated embodiment of FIG. 11, the etched ends of each of the semiconductor layers 1010A-B are approximately vertical (e.g., in parallel with the sidewalls of the dummy gate structures 610A-B, it should be understood that the etched ends may be curved inwardly or outwardly. In an example where the semiconductor layers 1020A-B include Si, and the semiconductor layers 1010A-B include $Si_{1-x}Ge_x$, the pull-back process may include a hydrogen chloride (HCl) gas isotropic etch process, which etches SiGe without attacking Si. As such, the Si layers 1020A-B may remain intact during this process.

Next, the inner spacers 1110A-B can be formed along the etched ends of each of the semiconductor layers 1010A-B. Thus, the inner spacers 1110A-B (e.g., their respective inner sidewalls) may follow the profile of the etched ends of the semiconductor layers 1010A-B. In some embodiments, the inner spacers 1110A-B can be formed conformally by chemical vapor deposition (CVD), or by monolayer doping (MLD) of nitride followed by spacer RIE. The inner spacers 1110A-B can be deposited using, e.g., a conformal deposition process and subsequent isotropic or anisotropic etch back to remove excess spacer material on the sidewalls of the stacks of the fin structure 401 and on a surface of the semiconductor substrate 302. A material of the inner spacers 1110A-B can be formed from the same or different material as the dummy gate structures 610A-B. For example, the inner spacers 1110A-B can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 12:
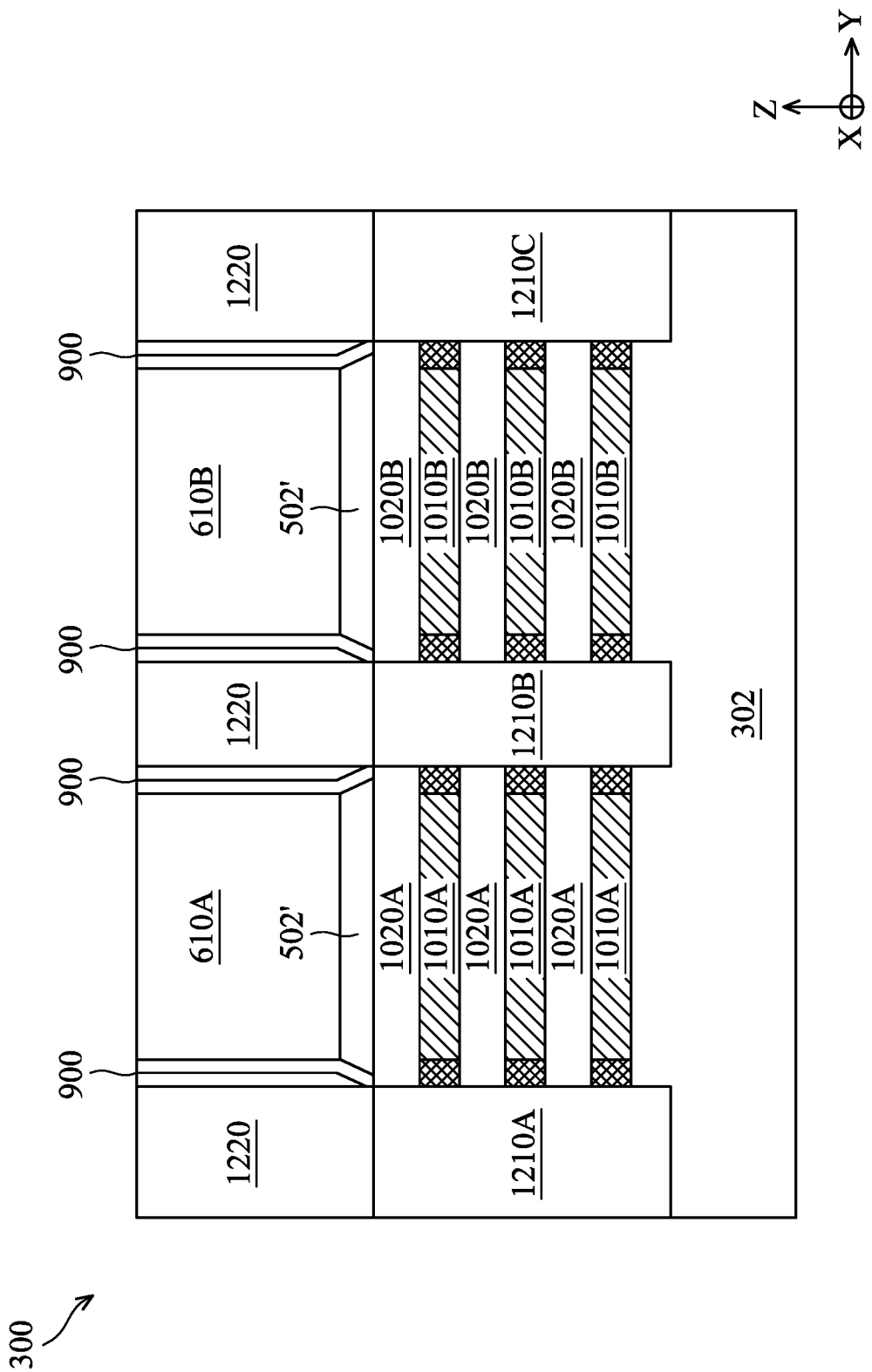

Corresponding to operation 218 of FIG. 2, FIG. 12 is a cross-sectional view of the GAA FET device 300 including source/drain structures 1210A, 1210B, and 1210C that are overlaid by an interlayer dielectric (ILD) 1220, at one of the various stages of fabrication. The cross-sectional view of FIG. 12 is cut in a direction perpendicular to the lengthwise direction of an active/dummy gate structure of the GAA FET device 300 (e.g., cross-section A-A indicated in FIG. 1).

The source/drain structures 1210A-C may be formed using an epitaxial layer growth process on exposed ends of each of the semiconductor layers 1020A-B. In some embodiments, a bottom surface of the source/drain structures 1210A-C may be leveled with the top surface of an isolation structure (not shown) that embeds a lower portion of the fin structure 401. In some other embodiments, the bottom surface of the source/drain structures 1210A-C may be lower than the top surface of such an isolation structure. On the other hand, in some embodiments, a top surface of the source/drain structures 1210A-C may be higher than a top surface of the topmost semiconductor layers 1010A-B, as shown in FIG. 12. In some other embodiments, the top surface of the source/drain structures 1210A-C may be leveled with or lower than the top surface of the topmost semiconductor layers 1010A-B.

The source/drain structures 1210A-C are electrically coupled to the respective semiconductor layers 1020A-B. For example, the source/drain structures 1210A-B can be electrically coupled to the semiconductor layers 1020A; and the source/drain structures 1210B-C can be electrically coupled to the semiconductor layers 1020B. In various embodiments, the semiconductor layers 1020A may collectively function as the conduction channel of a first GAA transistor (hereinafter "GAA transistor 1250A"); and the semiconductor layers 1020B may collectively function as the conduction channel of a second GAA transistor (hereinafter "GAA transistor 1250B"). It should be noted that at this stage of fabrication, the GAA transistors 1250A-B are not finished yet.

In-situ doping (ISD) may be applied to form doped source/drain structures 1210A-C, thereby creating the junctions for the GAA transistors 1250A-B. N-type and p-type FETs are formed by implanting different types of dopants to selected regions (e.g., the source/drain structures 1210A-C) of the device to form the junction(s). N-type devices can be formed by implanting arsenic (As) or phosphorous (P), and p-type devices can be formed by implanting boron (B).

Upon forming the source/drain structures 1210A-C, the ILD 1220 can be formed by depositing a dielectric material in bulk over the partially formed GAA transistors 1250A-B, and polishing the bulk oxide back (e.g., using CMP) to the level of the dummy gate structures 610A-B. The dielectric material of ILD 1220 includes silicon oxide, phosphosilicate glass (PSG), borosilicate glass (BSG), boron-doped phosphosilicate Glass (BPSG), undoped silicate glass (USG), or combinations thereof.

Figure 13:
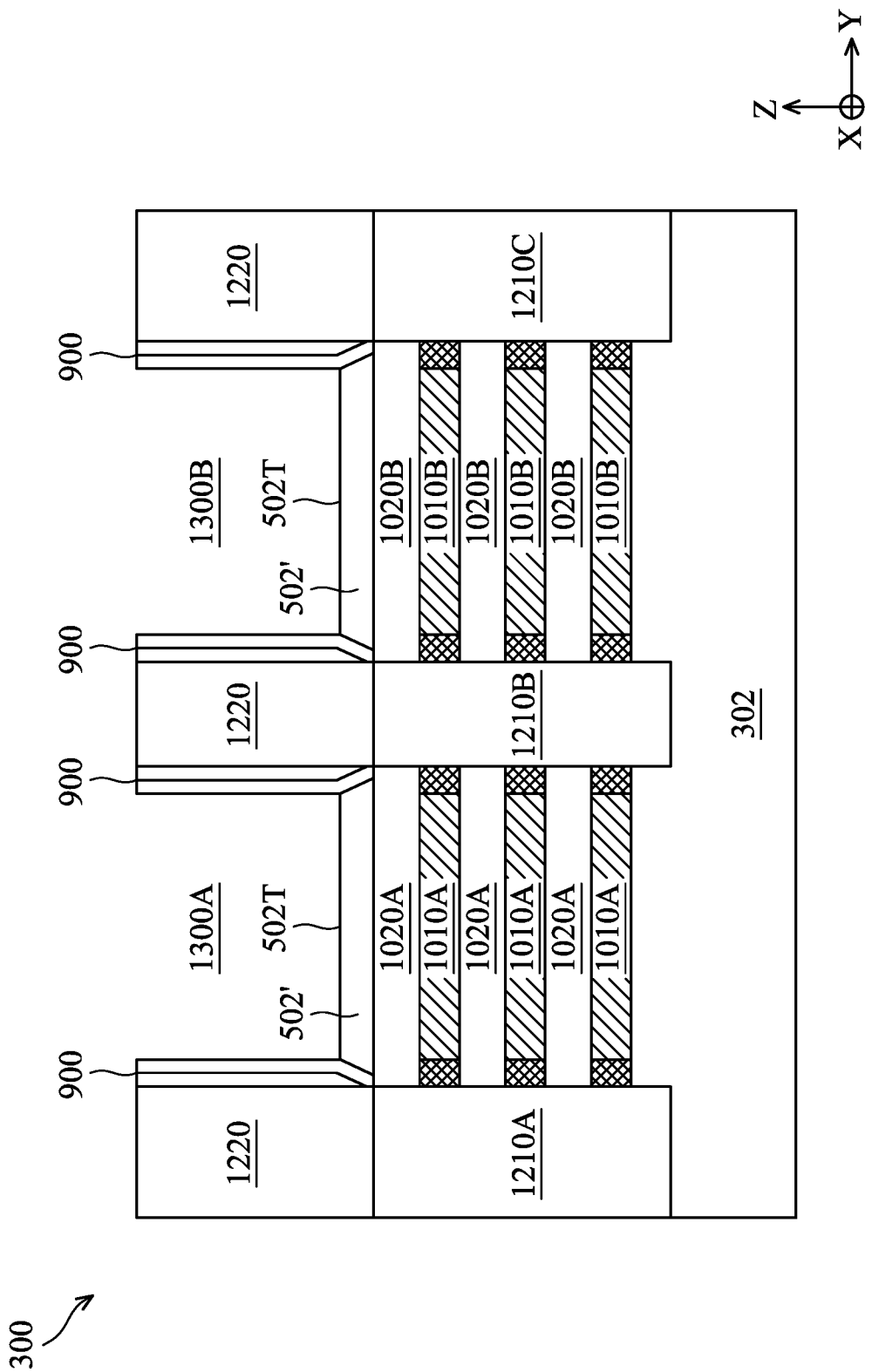

Corresponding to operation 220 of FIG. 2, FIG. 13 is a cross-sectional view of the GAA FET device 300 in which the dummy gate structures 610A-B (FIG. 12) are removed, at one of the various stages of fabrication. The cross-sectional view of FIG. 13 is cut in a direction perpendicular to the lengthwise direction of an active/dummy gate structure of the GAA FET device 300 (e.g., cross-section A-A indicated in FIG. 1).

Subsequently to forming the ILD 1220 (FIG. 12), the dummy gate structures 610A-B are removed, thereby forming gate trenches 1300A and 1300B, respectively. The dummy gate structures 610A-B can be removed by a known etching process, e.g., RIE or chemical oxide removal (COR). After the removal of the dummy gate structures 610A-B (forming the gate trenches 1300A-B), the top surface 502T of the patterned ESL 502' is exposed. Although not shown in the cross-sectional view of FIG. 13, it should be appreciated that in addition to the top surface 502T of the patterned ESL 502', the sidewalls of each of the semiconductor layers 1010A-B and 1020A-B (facing the X direction) may be exposed, in some embodiments.

Figure 14A:
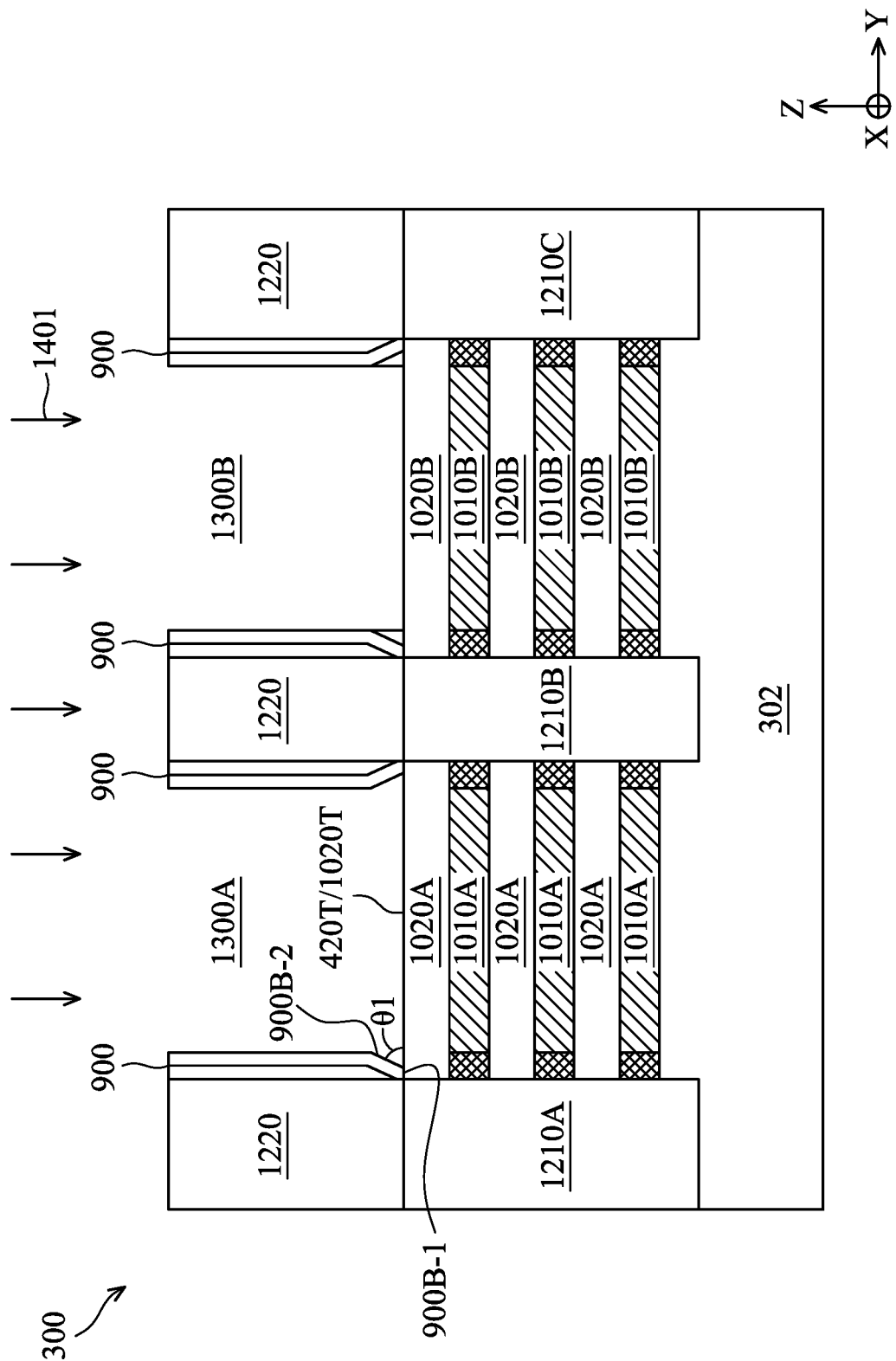
Figure 14B:
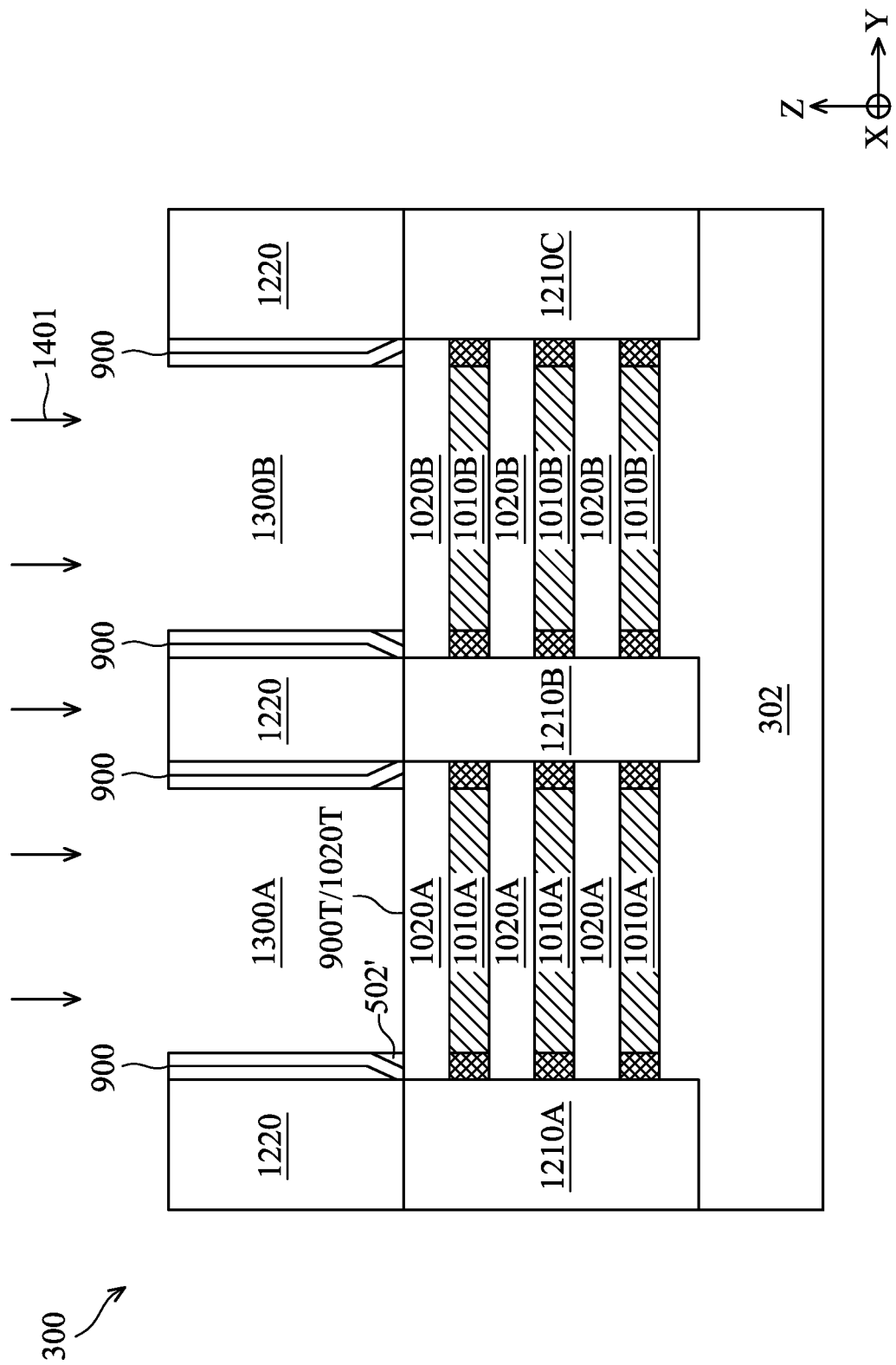

Corresponding to operation 222 of FIG. 2, FIG. 14A is a cross-sectional view of the GAA FET device 300 in which the patterned ESL 502' is fully removed, at one of the various stages of fabrication. Corresponding the same operation, FIG. 14B is a cross-sectional view of the GAA FET device 300 in which the patterned ESL 502' is partially removed, at one of the various stages of fabrication. The cross-sectional views of FIGS. 14A-B are each cut in a direction perpendicular to the lengthwise direction of an active/dummy gate structure of the GAA FET device 300 (e.g., cross-section A-A indicated in FIG. 1).

The patterned ESLs 502' (FIG. 13) may be removed to further extend the gate trenches 1300A-B by an etching process 1401. Such an etching process 1401 may stop when the topmost semiconductor layers 1020A-B are exposed, which will be discussed in further detail below. In some embodiments, the patterned ESL 502' can be fully removed from the topmost semiconductor layer 1020A-B. As such, the gate trenches 1300A-B can each further extend between the portion 900B-2 of the bottom surface 900B of the gate spacer 900 and the top surface 420T of the topmost semiconductor layer 1020A-B (which is sometimes referred to as "top surface 1020T"), as illustrated in FIG. 14A. The gate trenches 1300A-B can thus inherit the angle, $\theta_1$. In some embodiments, the patterned ESL 502' can be partially removed from the topmost semiconductor layer 1020A-B. As such, a remaining portion of the patterned ESL 502' can exist between the portion 900B-2 of the bottom surface 900B of the gate spacer 900 and the top surface 420T of the topmost semiconductor layer 1020A-B (which is sometimes referred to as "top surface 1020T"), as illustrated in FIG. 14B. In some embodiments, respective sidewalls of the remaining patterned ESL 502' and the gate spacer 900, exposed by the gate trench 1300A/B, may be vertically aligned with each other. The remaining patterned ESL 502' can thus inherit the angle, $\theta_1$.

The etching process 1401 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to stop the etching when the topmost semiconductor layers 1020A-B are exposed. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process 1401. However, it is noted that source powers, bias powers, pressures, and flow rates outside of these ranges are also contemplated.

In another example, the etching process 1401 can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to stop the etching when the topmost semiconductor layers 1020A-B are exposed.

Figure 15A:
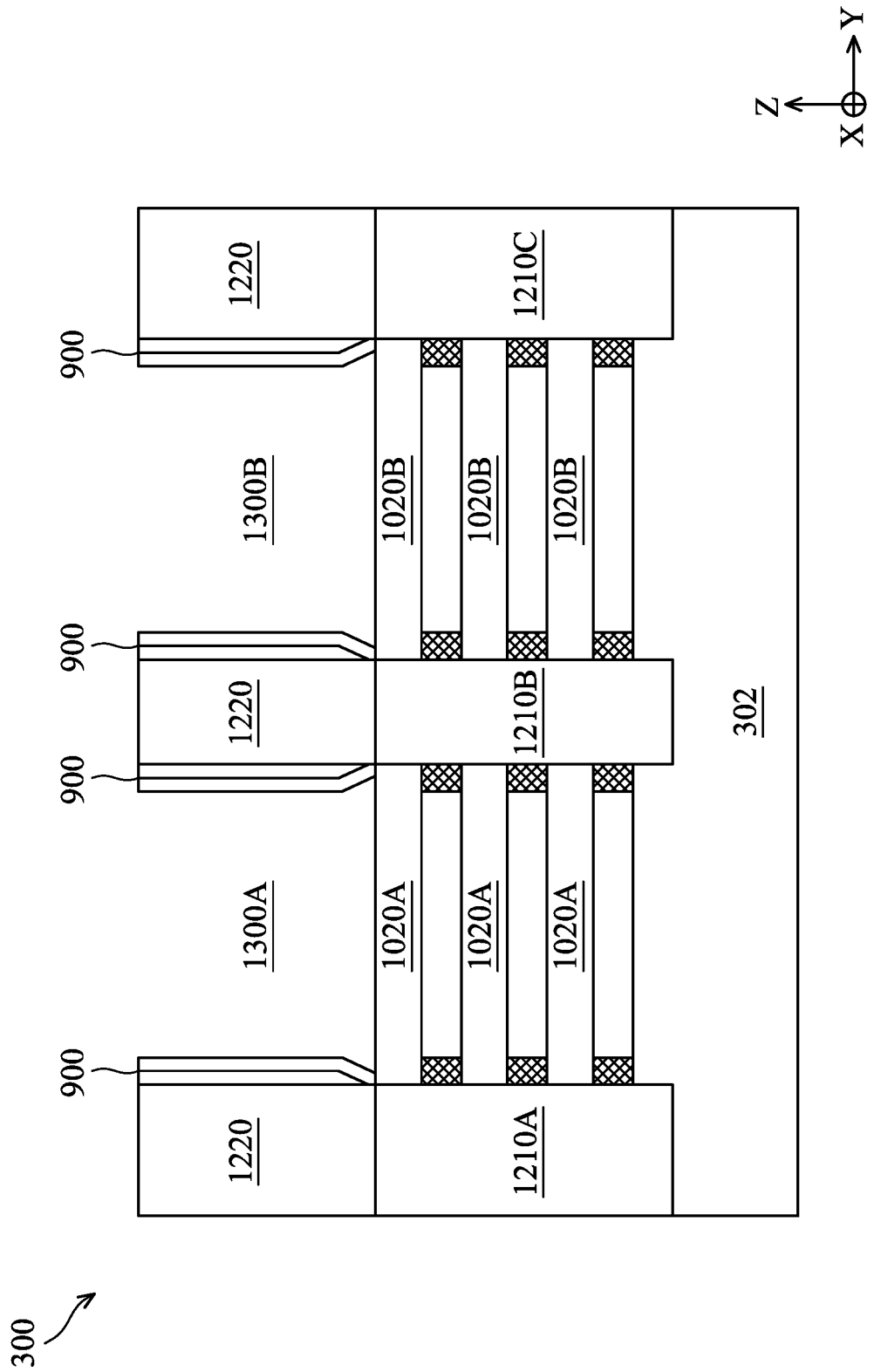
Figure 15B:
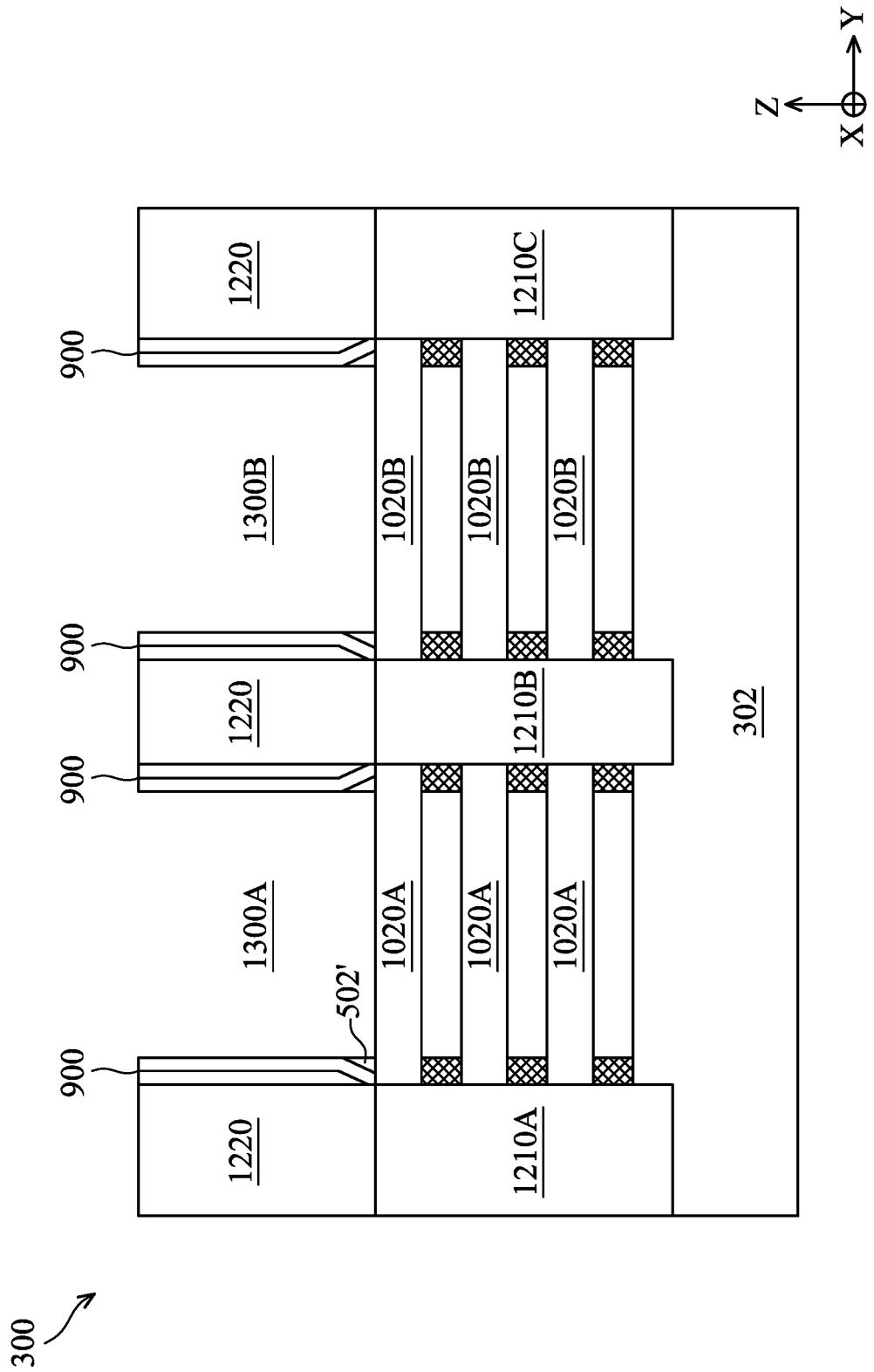

Corresponding to operation 224 of FIG. 2, FIG. 15A is a cross-sectional view of the GAA FET device 300 in which the semiconductor layers 1010A-B are removed, with no remaining patterned ESL 502' (FIG. 14A), at one of the various stages of fabrication. Corresponding the same operation, FIG. 15B is a cross-sectional view of the GAA FET device 300 in which the semiconductor layers 1010A-B are removed, with some remaining ESL 502' (FIG. 14B), at one of the various stages of fabrication. The cross-sectional views of FIGS. 15A-B are each cut in a direction perpendicular to the lengthwise direction of an active/dummy gate structure of the GAA FET device 300 (e.g., cross-section A-A indicated in FIG. 1).

Subsequently to exposing the topmost semiconductor layers 1020A-B (referring again to FIGS. 14A-B), the semiconductor layers 1010A-B are removed by applying a selective etch (e.g., a hydrochloric acid (HCl)), while leaving the semiconductor layers 1020A-B substantially intact.

After the removal of the semiconductor layers 1010A-B, respective bottom surface and/or top surface of each of the semiconductor layers 1020A-B may be exposed by further extending the gate trenches 1300A-B, in accordance with various embodiments. For example, upon removing the semiconductor layers 1010A-B, the gate trenches 1300A-B can be further extended from a region that is above the topmost semiconductor layers 1010A-B to a region that is below the topmost semiconductor layers 1010A-B. Consequently, the bottom surface of each of the topmost semiconductor layers 1020A-B can be exposed, and the respective top and bottom surfaces of each of the rest of the semiconductor layers 1020A-B can also be exposed.

Figure 16A:
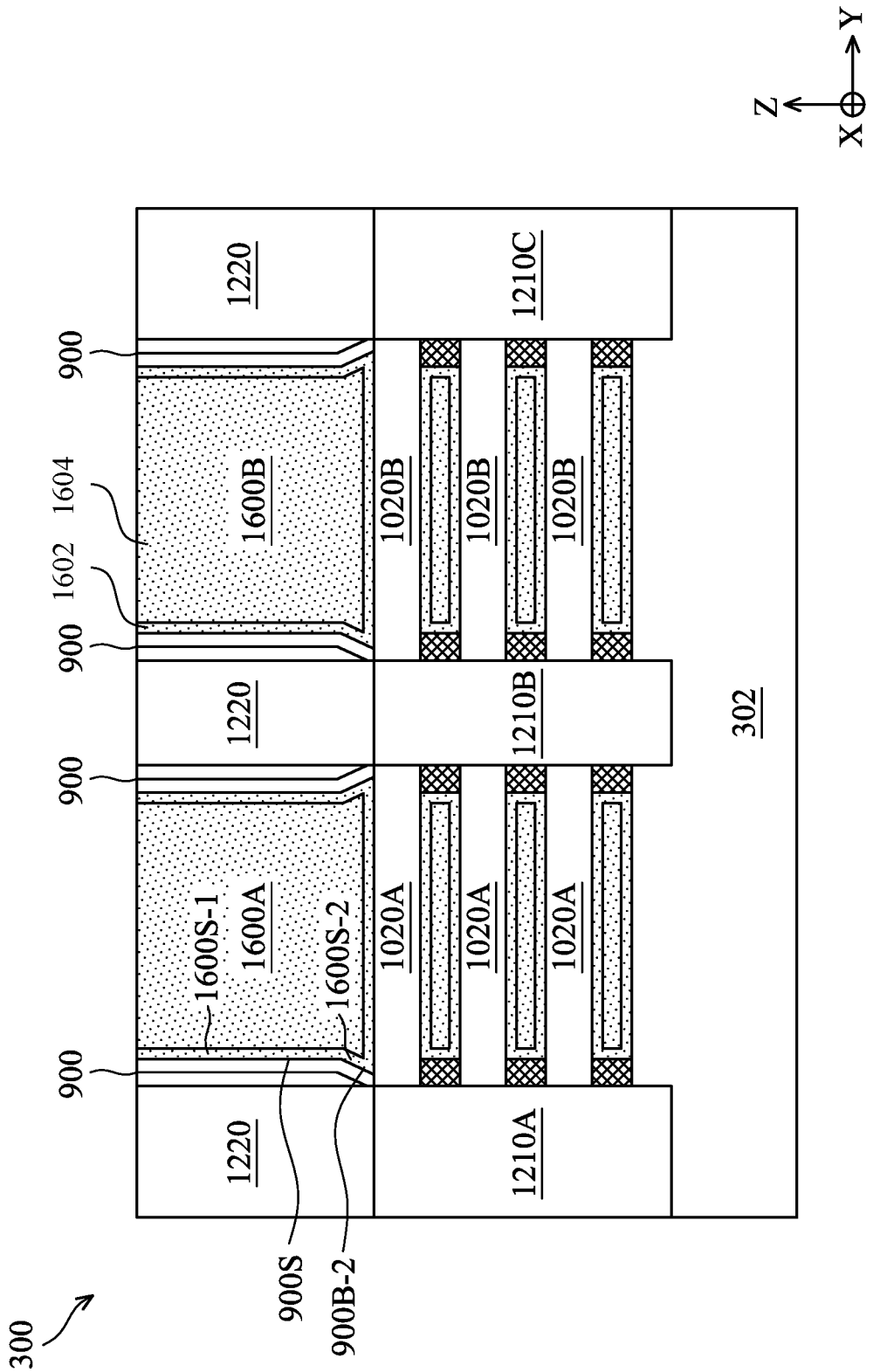
Figure 16B:
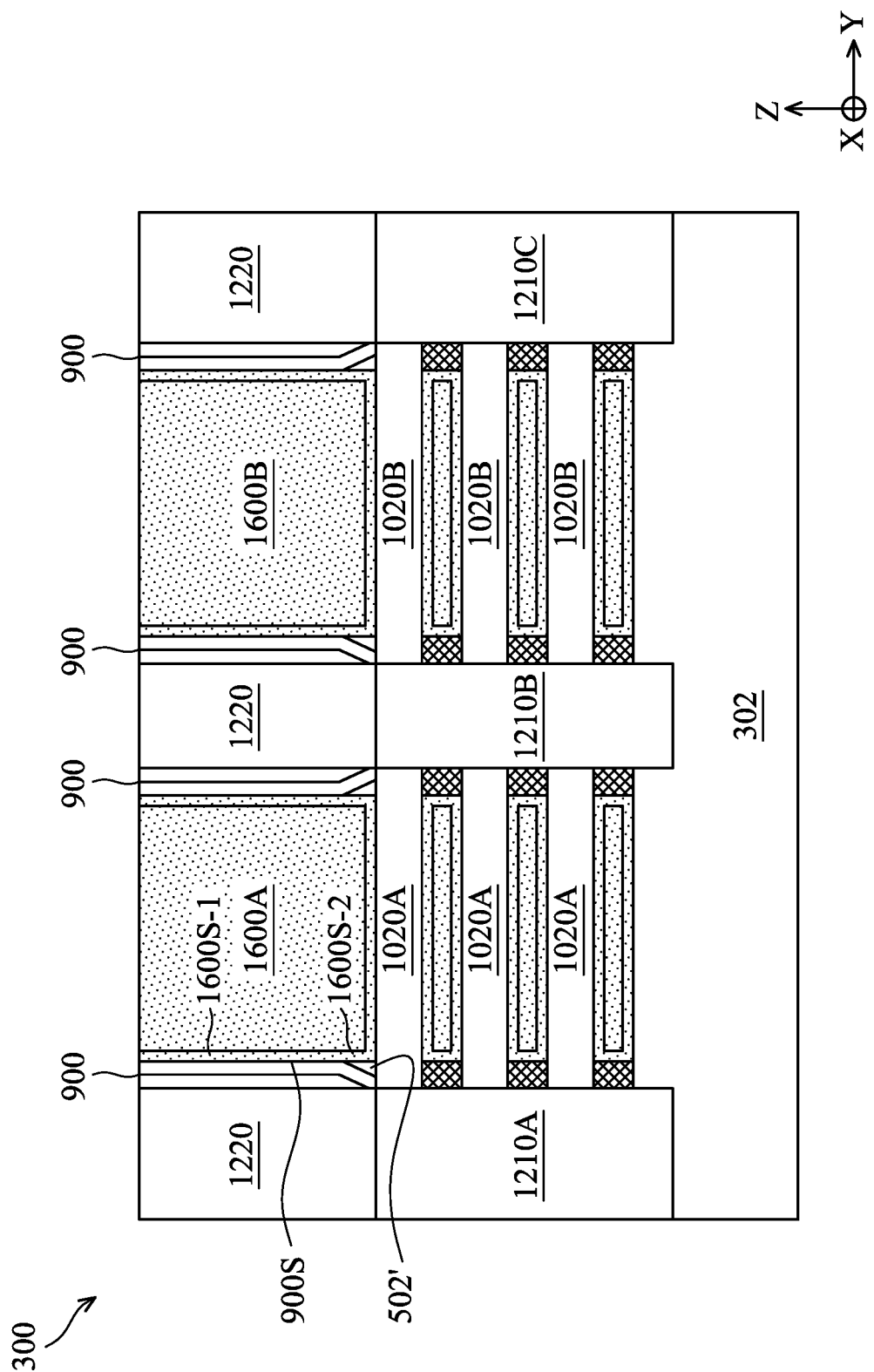

Corresponding to operation 226 of FIG. 2, FIG. 16A is a cross-sectional view of the GAA FET device 300 including active gate structures 1600A and 1600B formed in the gate trenches 1300A-B (FIG. 15A), respectively, at one of the various stages of fabrication. Corresponding to the same operation, FIG. 16B is a cross-sectional view of the GAA FET device 300 including active gate structures 1600A and 1600B formed in the gate trenches 1300A-B (FIG. 15B), respectively. The cross-sectional views of FIGS. 16A-B are each cut in a direction perpendicular to the lengthwise direction of an active/dummy gate structure of the GAA FET device 300 (e.g., cross-section A-A indicated in FIG. 1).

The active gate structures 1600A-B are formed in the extended gate trenches 1300A-B (FIG. 15A/B) by filling a gate dielectric and a gate metal, while leaving other components (e.g., the gate spacer 900, the remaining patterned ESL 302') substantially intact, and thus, the active gate structures 1600A-B can inherit the dimensions and profiles of the gate trenches 1300A-B, respectively.

For example in FIG. 16A-B, the active gate structures 1600A-B can each include an upper portion and a lower portion that may be separated by the topmost semiconductor layer 1020A/B. The upper portion may be surrounded by the gate spacer 900, and the lower portion may wrap around each of the semiconductor layers 1020A/B. Specifically in FIG. 16A, a first portion 1600S-1 of a sidewall of the upper portion of the active gate structure 1600A/B can extend along (e.g., contact) the substantially vertical sidewall 900S of the gate spacer 900, and a second portion 1600S-2 of the sidewall of the upper portion of the active gate structure 1600A/B can extend along (e.g., contact) the tilted portion 900B-2 of the bottom surface of the gate spacer 900. In such embodiments, the active gate structure 1600A/B can have footing structures that each protrude away from one the other and from the vertical portion of the sidewall 1600S-1. Specifically in FIG. 16B, the first portion 1600S-1 of the sidewall of the upper portion of the active gate structure 1600A/B can extend along (e.g., contact) the substantially vertical sidewall 900S of the gate spacer 900, and the second portion 1600S-2 of the sidewall of the upper portion of the active gate structure 1600A/B can extend along (e.g., contact) the vertical sidewall of the remaining patterned ESL 502'.

Each of the active gate structures 1600A-B includes a gate dielectric and a gate metal, in some embodiments. For example in FIGS. 16A-B, each of the active gate structures 1600A-B includes a gate dielectric 1602 and a gate metal 1604. Although the gate dielectric 1602 and gate metal 1604 are each shown as a single layer, it should be understood that the gate dielectric 1602 and gate metal 1604 can each be formed as a multi-layer stack, while remaining within the scope of the present disclosure.

The gate dielectric 1602 can wrap around each of the semiconductor layers 1020A-B, e.g., the top and bottom surfaces and sidewalls facing the X direction). The gate dielectric 1602 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric 1602 may include a stack of multiple high-k dielectric materials. The gate dielectric 1602 can be deposited using any suitable method, including, for example, molecular beam deposition (MBD), atomic layer deposition (ALD), PECVD, and the like. In some embodiments, the gate dielectric 1602 may optionally include a substantially thin oxide (e.g., $SiO_x$) layer, which may be a native oxide layer formed on the surface of each of the semiconductor layers 1020A-B.

The gate metal 1604 can wrap around each of the semiconductor layers 1020A-B with the gate dielectric 1602 disposed therebetween. Specifically, the gate metal 1604 can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the semiconductor layers 1020A-B, with the gate dielectric 1602 disposed therebetween.

The gate metal 1604 may include a stack of multiple metal materials. For example, the gate metal 1604 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process.

In one aspect of the present disclosure, a semiconductor device is disclosed. The semiconductor device includes a plurality of semiconductor layers vertically separated from one another. The semiconductor device includes a gate structure that comprises a lower portion and an upper portion, wherein the lower portion wraps around each of the plurality of semiconductor layers. The semiconductor device includes a gate spacer that extends along a sidewall of the upper portion of the gate structure and has a bottom surface. A portion of the bottom surface of the gate spacer and a top surface of a topmost one of the plurality of semiconductor layers form an angle that is less than 90 degrees.

In another aspect of the present disclosure, a semiconductor device is disclosed. The semiconductor device includes a fin structure disposed over a substrate. The semiconductor device includes a gate structure that comprises a lower portion and an upper portion, wherein the lower portion straddles the fin structure. The semiconductor device includes a gate spacer that extends along a sidewall of the upper portion of the gate structure and includes a vertical portion and tilted portion. The vertical portion is in contact with the sidewall and the tilted portion overlays at least a first portion of a top surface of a topmost one of the plurality of semiconductor layers.

In yet another aspect of the present disclosure, a method for fabricating a semiconductor device is disclosed. The method includes forming a fin structure extending along a first lateral direction, wherein the fin structure includes a plurality of first semiconductor layers and a plurality of second semiconductor layers alternately disposed on top of one another. The method includes forming an etch stop layer over the fin structure. The method includes forming a dummy gate structure over the fin structure, with the etch stop layer disposed therebetween, wherein the dummy gate structure extends along a second direction perpendicular to the first lateral direction. The method includes patterning the etch stop layer using the dummy gate structure as a mask. The method includes forming a gate spacer extending along a sidewall of the dummy gate structure and the patterned etch stop layer. The method includes forming an active gate structure by replacing the dummy gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of semiconductor layers vertically separated from one another;
   a gate structure that comprises a lower portion and an upper portion;
   an etch stop layer; and
   a gate spacer that extends along a sidewall of the upper portion of the gate structure and has a bottom surface;
   wherein a portion of the bottom surface of the gate spacer and a top surface of a topmost one of the plurality of semiconductor layers form an angle that is less than 90 degrees; and
   wherein the etch stop layer extends between the portion of the bottom surface of the gate spacer and the top surface of the topmost semiconductor layer.

2. The semiconductor device of claim 1, wherein the gate structure has a lower side portion extending between the portion of the bottom surface of the gate spacer and the top surface of the topmost semiconductor layer.

3. The semiconductor device of claim 1, wherein the etch stop layer has a sidewall vertically aligned with the sidewall of the upper portion of the gate structure.

4. The semiconductor device of claim 1, wherein the gate spacer comprises a plurality of dielectric layers.

5. The semiconductor device of claim 4, wherein at least one of the plurality of dielectric layers has a tilted portion that forms the bottom surface of the gate spacer.

6. The semiconductor device of claim 5, wherein the tilted portion is in contact with the top surface of the topmost semiconductor layer.

7. The semiconductor device of claim 5, wherein the tilted portion extends away from the sidewall of the upper portion of the gate structure.

8. The semiconductor device of claim 1, further comprising a source/drain structure coupled to the plurality of semiconductor layers, wherein the source/drain structure is electrically isolated from the gate structure by the gate spacer.

9. A semiconductor device, comprising:
a fin structure disposed over a substrate, wherein the fin structure includes a plurality of semiconductor layers;
a gate structure that comprises a lower portion and an upper portion;
a gate spacer that extends along a sidewall of the upper portion of the gate structure and comprises a vertical portion and tilted portion, wherein the vertical portion is in contact with the sidewall and the tilted portion overlays at least a first portion of a top surface of a topmost one of the plurality of semiconductor layers; and
an etch stop layer extending between the tilted portion and a second portion of the top surface of the topmost semiconductor layer that is not overlaid by the tilted portion.

10. The semiconductor device of claim 9, wherein the plurality of semiconductor layers is vertically separated from one another, and the gate structure wraps around each of the plurality of semiconductor layers.

11. The semiconductor device of claim 9, wherein the gate structure has a lower side portion extending between the tilted portion and the second portion of the top surface of the topmost semiconductor layer that is not overlaid by the tilted portion.

12. The semiconductor device of claim 9, wherein the etch stop layer has a sidewall vertically aligned with the sidewall of the upper portion of the gate structure.

13. The semiconductor device of claim 9, wherein the gate spacer comprises a plurality of dielectric layers.

14. The semiconductor device of claim 13, wherein at least one of the plurality of dielectric layers has the tilted portion to form a bottom surface of the gate spacer.

15. The semiconductor device of claim 14, wherein a portion of the bottom surface of the gate spacer and the second portion of the top surface of the topmost semiconductor layer that is not overlaid by the tilted portion form an angle less than 90 degrees.

16. A semiconductor device, comprising:
a plurality of semiconductor layers vertically separated from one another;
a gate structure that comprises a lower portion and an upper portion;
a gate spacer that extends along a sidewall of the upper portion of the gate structure and has a bottom surface;
wherein a portion of the bottom surface of the gate spacer and a top surface of a topmost one of the plurality of semiconductor layers form an angle that is less than 90 degrees;
wherein the gate spacer comprises a plurality of dielectric layers;
wherein at least one of the plurality of dielectric layers has a tilted portion that forms the bottom surface of the gate spacer; and
wherein the tilted portion extends away from the sidewall of the upper portion of the gate structure.

17. The semiconductor device of claim 16, wherein the gate structure has a lower side portion extending between the portion of the bottom surface of the gate spacer and the top surface of the topmost semiconductor layer.

18. The semiconductor device of claim 16, wherein the tilted portion is in contact with the top surface of the topmost semiconductor layer.

19. The semiconductor device of claim 16, further comprising a source/drain structure coupled to the plurality of semiconductor layers, wherein the source/drain structure is electrically isolated from the gate structure by the gate spacer.

20. The semiconductor device of claim 16, wherein the plurality of semiconductor layers is vertically separated from one another, and the gate structure wraps around each of the plurality of semiconductor layers.

* * * * *